(12) United States Patent
Tran et al.

(10) Patent No.: US 7,778,080 B2
(45) Date of Patent: Aug. 17, 2010

(54) FLASH MEMORY ARRAY SYSTEM INCLUDING A TOP GATE MEMORY CELL

(75) Inventors: Hieu Van Tran, San Jose, CA (US); Hung Quoc Nguyen, Fremont, CA (US); Anh Ly, San Jose, CA (US); Sheng-Hsiung Hsueh, San Jose, CA (US); Sang Thanh Nguyen, Union City, CA (US); Loc B. Hoang, San Jose, CA (US); Steve Choi, Irvine, CA (US); Thuan T. Vu, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 9 days.

(21) Appl. No.: 12/200,930

(22) Filed: Aug. 28, 2008

(65) Prior Publication Data

US 2009/0052248 A1  Feb. 26, 2009

Related U.S. Application Data

(60) Continuation of application No. 11/707,341, filed on Feb. 16, 2007, now Pat. No. 7,447,073, which is a division of application No. 11/235,901, filed on Sep. 26, 2005, now Pat. No. 7,567,458.

(51) Int. Cl.
*G11C 16/34* (2006.01)

(52) U.S. Cl. .................. 365/185.15; 365/185.14; 365/185.09; 365/185.22; 365/185.29

(58) Field of Classification Search ............ 365/185.09, 365/185.15, 185.14, 185.22, 185.18, 185.29, 365/185.33

See application file for complete search history.

(56) References Cited

U.S. PATENT DOCUMENTS

| | | | |
|---|---|---|---|
| 5,946,235 A | 8/1999 | Kramer et al. | |
| 5,969,383 A | 10/1999 | Chang et al. | |
| 6,002,620 A | 12/1999 | Tran et al. | |
| 6,282,145 B1 | 8/2001 | Tran et al. | |
| 6,324,092 B1 | 11/2001 | Jong et al. | |
| 6,396,745 B1 | 5/2002 | Hong et al. | |
| 6,504,755 B1 | 1/2003 | Katayama et al. | |
| 6,593,177 B2 | 7/2003 | Lee | |
| 6,687,162 B1 | 2/2004 | Hsueh et al. | |
| 6,747,310 B2 | 6/2004 | Fan | |
| 6,788,595 B2 | 9/2004 | Nguyen et al. | |
| 7,035,151 B2 | 4/2006 | Tran et al. | |
| 7,046,552 B2 | 5/2006 | Chen et al. | |
| 7,149,110 B2 | 12/2006 | Tran et al. | |
| 7,282,411 B2 | 10/2007 | Kanamitsu et al. | |
| 7,325,177 B2 | 1/2008 | Tran et al. | |
| 7,447,073 B2 * | 11/2008 | Tran et al. .............. | 365/185.15 |
| 7,567,458 B2 | 7/2009 | Tran et al. | |
| 7,626,863 B2 * | 12/2009 | Tran et al. .............. | 365/185.15 |

(Continued)

Primary Examiner—Andrew Q Tran
(74) Attorney, Agent, or Firm—DLA Piper LLP (US)

(57) ABSTRACT

A memory system includes memory cells arranged in sectors. A decoder corresponding to a sector disables memory cells having a defective top gate. The decoder may include a low voltage or high voltage latch for the disabling. A top gate handling algorithm is included. The memory system may include dynamic top gate coupling. A programming algorithm and waveforms with top gate handling is included.

35 Claims, 19 Drawing Sheets

U.S. PATENT DOCUMENTS

| | | | |
|---|---|---|---|
| 7,663,921 B2 * | 2/2010 | Van Tran et al. ....... 365/185.15 |
| 2005/0269622 A1 | 12/2005 | Klinger |
| 2007/0070703 A1 | 3/2007 | Tran et al. |
| 2007/0147111 A1 | 6/2007 | Tran et al. |
| 2007/0147131 A1 | 6/2007 | Tran et al. |
| 2009/0067239 A1 | 3/2009 | Tran et al. |
| 2009/0323415 A1 | 12/2009 | Tran et al. |

* cited by examiner

|  | SELECTED SEGMENT: | | | | | | UN-SELECTED SEGMENT | | | |
|---|---|---|---|---|---|---|---|---|---|---|
|  | WL1 | WL0,2-7 | TG0 | SL0 | BL2 | BL0,1,3-7 | WL8-N | TG1-N | SL1-N | BLX-N: |
| ERASE: | VER | 0 | VTGE | 0 | 0 | 0 | 0 | VTGUNSEL | 0 | 0 |
| PROG: | VWLP | 0 | VTGP | VSLP | IPROG | VBLINH | 0 | VTGUNSEL | 0 | VBLINH |
| READ: | VWLRD | 0 | VTGRD | 0 | 0 | 0 | 0 | VTGUNSEL | 0 | 0 |

NOTES: EXAMPLE
VER = 11.5V AND VTGE = 0V OR VER = 5V AND VTGE = -10V
VWLP = ~1.5V    VTGP = ~10V    VSLP = ~5V    VBLINH = VDD
VWLRD = VDD    VTGRD = VDD
VTGUNSEL = VDD    IPROG ≈ 0.025 μa to 10 μa

FIG. 7

FLASH MEMORY ARRAY SYSTEM INCLUDING A TOP GATE MEMORY CELL

CROSS REFERENCE TO RELATED APPLICATION(S)

This is a continuation of application No. 11/707,341, filed Feb. 16, 2007, published as 2007/0147131A1, now U.S. Pat. No. 7,447,073, which is a divisional of application Ser. No. 11/235,901, filed Sep. 26, 2005, published as 2007/0070703A1, now U.S. Pat. No. 7,567,458, all of which are incorporated herein by reference in entirety.

BACKGROUND

1. Field

The present invention relates to a flash memory array system, and more particularly to a flash memory array system with multilevel memory cells having a top gate.

2. Description of Related Information

A conventional mixed mode integrated circuit system frequently uses different voltage supplies. Analog signal processing, such as amplification, comparison, impulsive generation, may be performed at high voltage. A flash memory applies an erase signal, a programming signal and a read signal to flash memory cells. The erase signal, programming signal, and read signal have voltage levels greater than a supply voltage. Also in multilevel volatile memories, the variation of the voltage level of the signal falls in a smaller range for the multi-bits signals stored in the memory cells. A charge pump and a voltage regulator may be used to generate the erase signal, the programming signal, and the read signal. Flash memory cells have a select gate, a top gate and a floating gate for charge storage in response to the erase signal, the programming signal and the read signal.

SUMMARY

A memory system comprises a plurality of memory cells arranged in sectors. Each memory cell has a top gate. The memory system further comprises a control circuit coupled to the plurality of memory cells to control the disabling of top gates of memory cells that are defective. The memory cells may be multilevel memory cells.

In another aspect, a memory system comprises a plurality of memory cells arranged in sectors. Top gates of memory cells in a sector are coupled to a first line; source lines of memory cells in the sector are coupled to a second line.

BRIEF DESCRIPTION OF THE DRAWINGS

FIG. 7 is a table illustrating operating voltages for array operation.

DETAILED DESCRIPTION

A method and apparatus for a four terminal source side injection flash memory system including a top gate, and more particularly a four terminal source side injection flash memory cell with top gate operation is described.

The system includes a bad top gate latch for disabling by either serial loading, parallel loading or shared decoding loading. The system also includes dynamic top gate coupling operation. Various top gate array architectures are described with performance tradeoffs.

Figure 1:
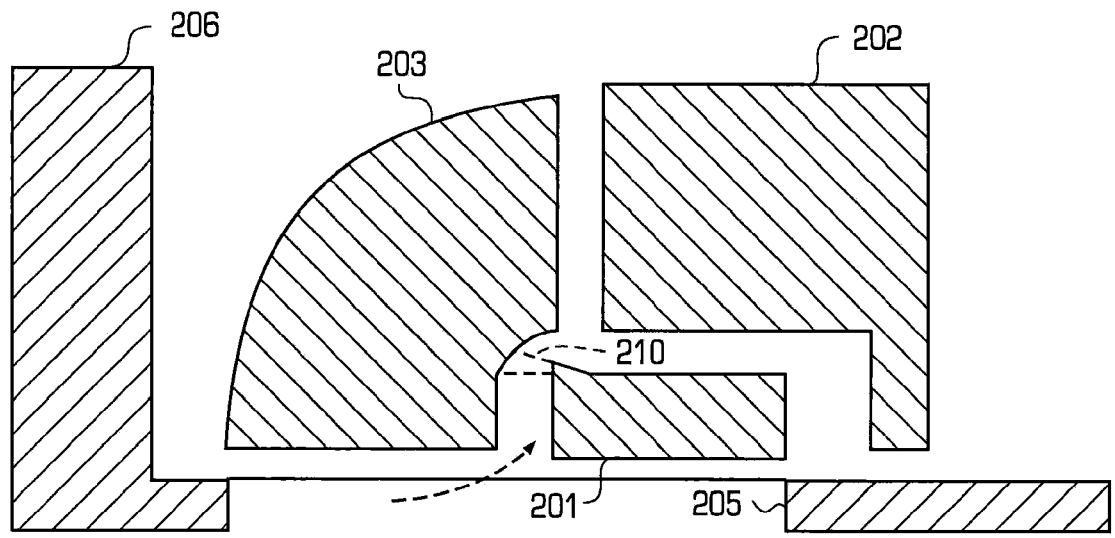
FIG. 1 is a cross-sectional view of a source side injection flash memory cell with a top gate.
Figure 2:
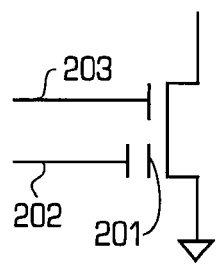
FIG. 2 is a schematic symbol of a cell structure of a four terminal source side injection flash cell of FIG. 1.

FIG. 1 is a cross-sectional view of a source side injection flash memory cell with a top gate. FIG. 2 is a diagram illustrating a transistor symbol corresponding to the four terminal source side injection flash cell of FIG. 1.

To facilitate the understanding of the invention, a brief description of a memory cell technology is described below. In an embodiment the invention applies to Source Side Injection (SSI) flash memory cell technology, which will be referred to as SSI flash memory cell technology. The invention is equally applicable to other technologies such as drain-side channel hot electron (CHE) programming (ETOX), P-channel hot electron programming, other hot electron programming schemes, Fowler-Nordheim (FN) tunneling, ferroelectric memory, and other types of memory technology.

This cell may be formed of three polysilicon gates (abbreviated as poly), a floating gate poly FG 201, a top coupling gate poly TG 202, and a select gate (also known as word line, which is used interchangeably herein) poly SG 203. The select gate SG 203 may also act as a select gate that individually selects each memory cell. This has the advantage of avoiding the over erase problem which is typical of stacked gate CHE flash cell. The floating gate 201 has a poly tip structure that points to the word line 203 to enhance the electric field from the floating gate 201 to the word line 203, which allows a much lower voltage in FN erase without using a thin interpoly oxide. The top gate 202 acts to couple voltage to the FG 201 during programming, erase and read operations. The top gate 202 may also act to select or deselect each memory cell.

The thicker interpoly oxide leads to a higher reliability memory cell. The top gate TG 202 may provide a very high coupling ratio from TG 202 into the FG 201, which is advantageous to SSI programming and allows a low erase voltage, which is described below. A structural gap between the FG 201 and SG 203 is also advantageous for the efficient SSI programming. The cell may also be fabricated such that a major portion of the FG 201 overlaps the source junction 205. This may also make a very high coupling ratio from the source gate for the floating gate 201, which allows a lower erase voltage and is advantageous to the SSI programming.

The SSI flash memory cell enables low voltage and low power performance due to its intrinsic device physics resulting from its device structure. The SSI flash cell uses efficient FN tunneling for erase and efficient SSI for programming. The SSI flash cell programming requires a small current in hundreds of nano amps and a moderate voltage range of about 8 to 11 volts. This is in contrast to that of a typical drain-side channel hot electron memory cell programming which requires current in hundreds of microamp to milliamp range and a voltage in the range of 11 to 13 volts.

The SSI flash memory cell erases by utilizing Fowler-Nordheim tunneling from the floating gate poly to the select gate poly by applying a high erase voltage on the word line 203, e.g., 5-13 volts, and a low voltage on the source 205, e.g., 0-1.5 volts, and a low or negative voltage on the top gate 202, e.g., 0V or −5 to −12V. The high erase voltage together with high coupling from the top gate and source to the floating gate 201 creates a localized high electric field from the tip of the floating gate 201 to the word line 203 and causes electrons to tunnel from the floating gate 201 to the word line 203 near the tip region. The resulting effect causes a net positive charge on the floating gate 201. An alternative erase may be done by applying a high voltage on the word line 203 and a negative voltage on the channel and/or the top gate 202. Another alternative erase may be done from the floating gate 201 to the top gate 202 by applying a low or negative voltage on the word line 203 and/or source drain and a positive high voltage on the top gate 202. In this case, an erase may be done by the tip from the floating gate 201 to the top gate 202 at the wrap around on the right side of FIG. 1.

The SSI flash memory cell programs by applying a medium high voltage on a source 205 (herein also known as common line CL), e.g., 3.5-6 V, a low voltage on the word line 203, e.g., 0.7-2.5 V, a high voltage on the top gate TG 202, e.g., 8-13 V, and a low voltage on the drain 206 (herein also known as the bitline BL), e.g., 0-1V or a current bias on the drain 206, e.g., 0.050-10 microamps. The high voltage on the top gate 202 and a medium high voltage on the source 205 are strongly coupled to the FG to strongly turn on the channel under the floating gate (it will be equivalently referred to as the FG channel). This in turn couples the medium high voltage on the source 205 toward the gap region. The voltage on the word line 203 turns on the channel directly under the word line 203 (it will be equivalently referred to as the SG channel). This in turn couples the voltage on the drain 206 toward the gap region. Hence the electrons flow from the drain junction 206 through the SG channel, through the gap channel, through the FG channel, and finally arrive at the source junction.

Due to the gap structure between the word line 203 and the floating gate 201, in the channel under the gap, there exists a strong lateral electric field EGAPLAT 210. As the EGAPLAT 210 reaches a critical field, electrons flowing across the gap channel become hot electrons. A portion of these hot electrons gains enough energy to cross the interface between the silicon and silicon dioxide into the silicon dioxide. And as the vertical field Ev is very favorable for electrons to move from the channel to the floating gate 201, many or most of these hot electrons are swept toward the floating gate 201, thus, reducing the voltage on the floating gate 201. The reduced voltage on floating gate 201 reduces electrons flowing into the floating gate 201 as programming proceeds.

Due to the coincidence of favorable Ev and high EGAPLAT 210 in the gap region, the SSI memory cell programming is more efficient over that of the drain-side CHE programming, which only favors one field over the other. Programming efficiency is measured by how many electrons flow into the floating gate as a portion of the current flowing in the channel. High programming efficiency allows reduced power consumption and parallel programming of multiple cells in a page mode operation.

The memory cell may be fabricated using, for example, a method similar to that described in U.S. Pat. No. 6,593,177 by Dana Lee assigned to the same assignee as this patent application, the subject matter of which is incorporated herein by reference.

Figure 3:
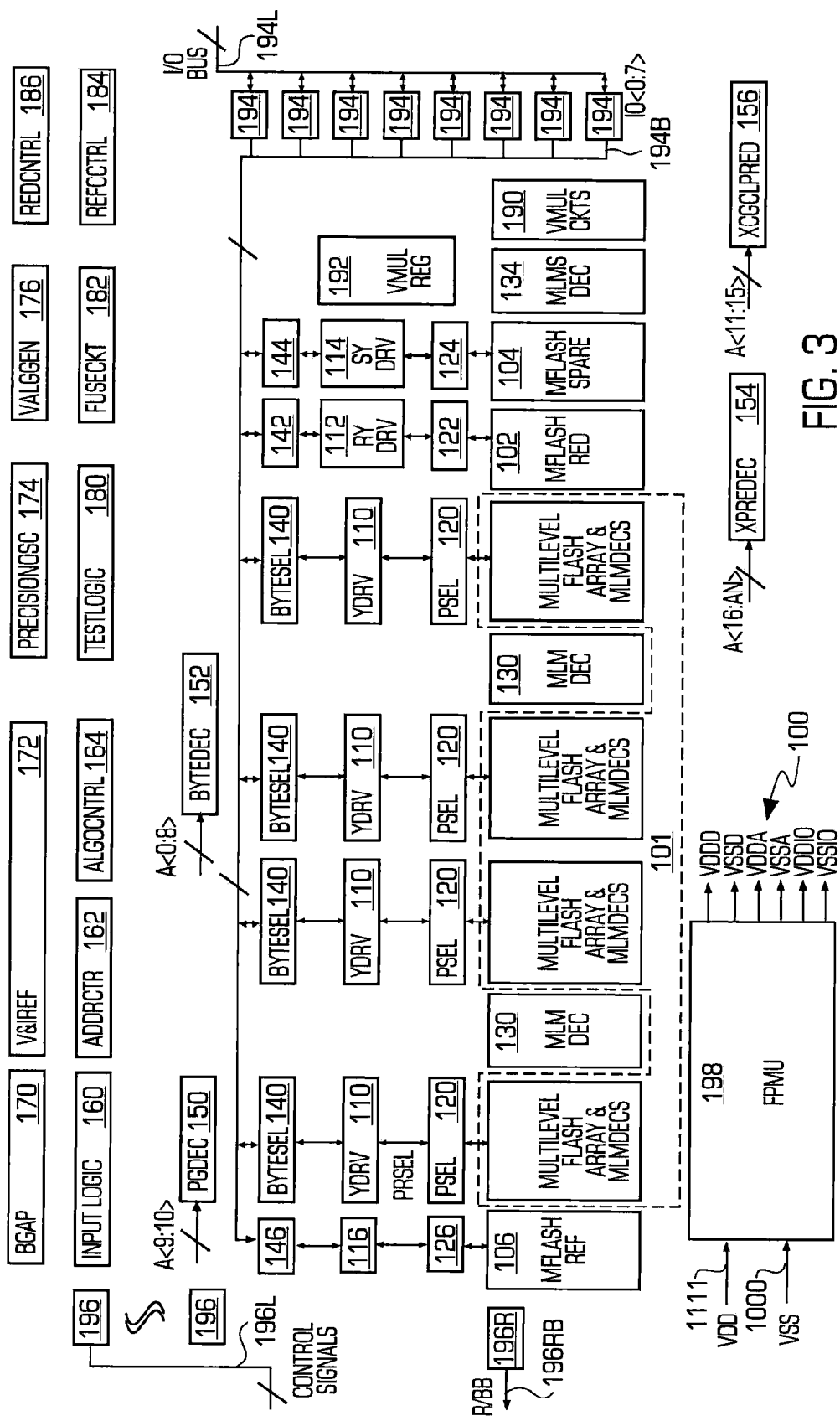
FIG. 3 is a block diagram illustrating a memory system.

FIG. 3 is a block diagram illustrating a digital multilevel bit memory array system 100. For clarity, some signal lines of the memory array system 100 are not shown in FIG. 1.

In one embodiment, the memory array includes a source side injection flash technology, which uses lower power in hot electron programming, and efficient injector based Fowler-Nordheim tunneling erasure. The programming may be done by applying a medium high voltage on the source of the memory cell, a high voltage on the top coupling gate of the memory cell, a bias voltage on the select gate of the memory cell, and a bias current on the drain of the memory cell. The programming in effect places electrons on the floating gate of memory cell. The erase is done by applying a high voltage on the select gate of the memory cell, a low or negative voltage on the top coupling gate, and a low or negative voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the select gate, a bias voltage or ground on the top coupling gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the select gate, a bias voltage or ground on the top coupling gate, a load (resistor or transistor) coupled to the drain (bitline) from a high voltage supply, and the voltage on the load is the readout voltage. In one embodiment, the array architecture and operating methods may be similar (with the addition of top coupling gate) the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The digital multilevel bit memory array system 100 includes a plurality of regular memory arrays 101, a plurality of redundant memory arrays (MFLASHRED) 102, a spare array (MFLASHSPARE) 104, and a reference array (MFLASHREF) 106. An N-bit digital multilevel cell is defined as a memory cell capable of storing $2^N$ levels.

In one embodiment, the memory array system 100 stores one gigabits of digital data with 4-bit multilevel cells, and the regular memory arrays 101 are equivalently organized as 8,192 columns and 32,768 rows. Addresses A<12:26> are used to select a row, and addresses A<0:11> are used to select two columns for one byte. A page is defined as a group of 512 bytes corresponding to 1,024 columns or cells on a selected row. A page is selected by the A<9:11> address. A row is defined here as including 8 pages. A byte within a selected page is selected by the address A<0:8>. Further, for each page of 512 regular data bytes, there are 16 spare bytes that are selected by the address A<0:3>, which are enabled by other control signals to access the spare array and not the regular array as is normally the case. Other organizations are possible such as a page including 1024 bytes or a row including 16 or 32 pages.

The reference array (MFLASHREF) 106 is used for a reference system of reference voltage levels to verify the contents of the regular memory array 101. In another embodiment, the regular memory arrays 101 may include reference memory cells for storing the reference voltage levels.

The redundancy array (MFLASHRED) 102 is used to increase production yield by replacing bad portions of the regular memory array 101.

The spare array (MFLASHSPARE) 104 may be used for extra data overhead storage such as for error correction and/or memory management (e.g., status of a selected block of memory being erased or programmed, number of erase and program cycles used by a selected block, or number of bad bits in a selected block). In another embodiment, the digital multilevel bit memory array system 100 does not include the spare array 104.

The digital multilevel bit memory array system 100 further includes a plurality of y-driver circuits 110, a plurality of redundant y-driver circuits (RYDRV) 112, a spare y-driver circuit (SYDRV) 114, and a reference y-driver (REFYDRV) circuit 116.

The y-driver circuit (YDRV) 110 controls bit lines (also known as columns, not shown in FIG. 1) during write, read, and erase operations. Each y-driver (YDRV) 110 controls one bitline at a time. Time multiplexing may be used so that each y-driver 110 controls multiple bit lines during each write, read, and erase operation. The y-driver circuits (YDRV) 110 are used for parallel multilevel page writing and reading to speed up the data rate during write to and read from the regular memory array 101. In one embodiment, for a 512-byte page with 4-bit multilevel cells, there are a total of 1024 y-drivers 110 or a total of 512 y-drivers 300.

The reference y-driver circuit (REFYDRV) 116 is used for the reference array (MFLASHREF) 106. In one embodiment, for a 4-bit multilevel cell, there are a total of 15 or 16 reference y-drivers 116. The function of the reference y-driver 116 may be similar to that of the y-driver circuit 110.

The redundant y-driver circuit (RYDRV) 112 is used for the redundant array (MFLASHRED) 102. The function of redundant y-driver circuit (RYDRV) 112 may be similar to that of the y-driver circuit (YRDRV) 110.

The spare y-driver circuit (SYDRV) 114 includes a plurality of single spare y-drivers (SYDRV) 114 used for the spare array (MFLASHSPARE) 104. The function of the spare y-driver circuit (SYDRV) 114 may be similar to the function of the y-driver circuit (YDRV) 110. In one embodiment, for a 512-byte page with 4-bit multilevel cells with 16 spare bytes, there are a total of 32 spare y-drivers 114.

The digital multilevel bit memory array system 100 further includes a plurality of page select (PSEL) circuits 120, a redundant page select circuit 122, a spare page select circuit 124, a reference page select circuit 126, a plurality of block decoders (BLKDEC) 130, a multilevel memory precision spare decoder (MLMSDEC) 134, a byte select circuit (BYTESEL) 140, a redundant byte select circuit 142, a spare byte select circuit 144, a reference byte select circuit 146, a page address decoder (PGDEC) 150, a byte address decoder (BYTEDEC) 152, an address pre-decoding circuit (X PREDEC) 154, an address pre-decoding circuit (XCGCLPRE1) 156, an input interface logic (INPUTLOGIC) 160, and an address counter (ADDRCTR) 162.

The page select circuit (PSEL) 120 selects one bit line (not shown) out of multiple bitlines for each single y-driver (YDRV) 110. In one embodiment, the number of multiple bitlines connected to a single y-driver (YDRV) 110 is equal to the number of pages. The corresponding select circuits for the reference array 106, the redundant memory array 102, and the spare memory array 104 are the reference page select circuit 126, the redundant page select circuit 122, and the spare page select circuit 124, respectively.

The byte select circuit (BYTESEL) 140 enables one byte data in or one byte data out of a pair of the y-driver circuits (YDRV) 110 at a time. The corresponding byte select circuits for the reference array 106, the redundant memory array 102, and the spare memory array 104 are the reference byte select circuit 146, the redundant byte select circuit 142, and the spare byte select circuit 144, respectively.

The block decoder (BLKDEC) 130 selects a row or a block of rows in the arrays 101 and 102 based on the signals from the address counter 162 (described below) and provides precise multilevel bias values over temperature, process, and power supply used for consistent single level or multilevel memory operation for the regular memory array 101 and the redundant memory array 102. The multilevel memory precision spare decoder (MLMSDEC) 134 selects a spare row or block of spare rows in the spare array 104 and provides precise multilevel bias values over temperature, process corners, and power supply used for consistent multilevel memory operation for the spare array 104. The intersection of a row and column selects a cell in the memory array. The intersection of a row and two columns selects a byte in the memory array.

The address pre-decoding circuit 154 decodes addresses. In one embodiment, the addresses are A<16:26> to select a block of memory array with one block comprising 16 rows. The outputs of the address pre-decoding circuit 154 are coupled to the block decoder 130 and the spare decoder 134. The address pre-decoding circuit 156 decodes addresses. In one embodiment, the addresses are addresses A<12:15> to select one row out of sixteen within a selected block. The outputs of address pre-decoding circuit 156 are coupled to the block decoder 130 and the spare decoder 134.

The page address decoder 150 decodes page addresses, such as A<9:11>, to select a page, e.g., P<0:7>, and provides its outputs to the page select circuits 120, 122, 124, and 126. The byte address decoder 152 decodes byte addresses, such as A<0:8>, and provides its outputs to the byte select circuit 140 to select a byte. The byte predecoder 152 also decodes spare byte address, such as A<0:3> and AEXT (extension address), and provides its outputs to the spare byte select circuit 144 to select a spare byte. A spare byte address control signal AEXT is used together with A<0:3> to decode addresses for the spare array 104 instead of the regular array 101.

The address counter (ADDRCTR) 162 provides addresses A<II:AN>, A<9:10>, and A<0:8> for row, page, and byte addresses, respectively. The outputs of the address counter (ADDRCTR) 162 are coupled to circuits 154, 156, 150, and 152. The inputs of the address counter (ADDRCTR) 162 are coupled from the outputs of the input interface logic (INPUTLOGIC) 160.

The input interface logic circuit (INPUTLOGIC) 160 provides an external interface to external systems, such as an external system microcontroller. Typical external interface for memory operations are read, write, erase, status read, identification (ID) read, ready busy status, reset, and other general purpose tasks. A serial interface can be used for the input interface to reduce pin counts for a high-density chip due to a large number of addresses. Control signals (not shown) couple the input interface logic circuit (INPUTLOGIC) 160 to the external system microcontroller. The input interface logic circuit (INPUTLOGIC) 160 includes a status register that indicates the status of the memory chip operation such as pass or fail in program or erase, ready or busy, write protected or unprotected, cell margin good or bad, restore or no restore, and the like.

The digital multilevel bit memory array system 100 further includes an algorithm controller (ALGOCNTRL) 164, a band gap voltage generator (BGAP) 170, a voltage and current bias generator (V&IREF) 172, a precision oscillator (OSC) 174, a voltage algorithm controller (VALGGEN) 176, a test logic circuit (TESTLOGIC) 180, a fuse circuit (FUSECKT) 182, a reference control circuit (REFCNTRL) 184, a redundancy controller (REDCNTRL) 186, voltage supply and regulator (VMULCKTS) 190, a voltage multiplexing regulator (VMULREG) 192, input/output (IO) buffers 194, and an input buffer 196.

The algorithm controller (ALGOCNTRL) 164 is used to handshake the input commands from the input logic circuit (INPUTLOGIC) 160 and to execute the multilevel erase, programming and sensing algorithms used for multilevel nonvolatile operation. The algorithm controller (ALGOCNTRL) 164 is also used to algorithmically control the precise bias and timing conditions used for multilevel precision programming.

The test logic circuit (TESTLOGIC) 180 tests various electrical features of the digital circuits, analog circuits, memory circuits, high voltage circuits, and memory array. The inputs of the test logic circuit (TESTLOGIC) 180 are coupled from the outputs of the input interface logic circuit (INPUTLOGIC) 160. The test logic circuit (TESTLOGIC) 180 also provides timing speed-up in production testing such as in faster write/read and mass modes. The test logic circuit (TESTLOGIC) 180 also provides screening tests associated with memory technology such as various disturb and reliability tests. The test logic circuit (TESTLOGIC) 180 also allows an off-chip memory tester to directly take over the control of various on-chip logic and circuit bias circuits to provide various external voltages and currents and external timing. This feature permits, for example, screening with external voltage and external timing or permits accelerated production testing with fast external timing.

The fuse circuit (FUSECKT) 182 is a set of nonvolatile memory cells configured at the external system hierarchy, at the tester, at the user, or on chip on-the-fly to achieve various settings. These settings can include precision bias values, precision on-chip oscillator frequency, programmable logic features such as write-lockout feature for portions of an array, redundancy fuses, multilevel erase, program and read algorithm parameters, or chip performance parameters such as write or read speed and accuracy.

The reference control circuit (REFCNTRL) 184 is used to provide precision reference levels for precision voltage values used for multilevel programming and sensing. The redundancy controller (REDCNTRL) 186 provides redundancy control logic.

The voltage algorithm controller (VALGGEN) 176 provides various specifically shaped voltage signals of amplitude and duration used for multilevel nonvolatile operation and to provide precise voltage values with tight tolerance, used for precision multilevel programming, erasing, and sensing. The bandgap voltage generator (BGAP) 170 provides a precise voltage value over process, temperature, and supply for multilevel programming and sensing.

The voltage and current bias generator (V&IREF) 172 is a programmable bias generator. The bias values are programmable by the settings of control signals from the fuse circuit (FUSECKT) 182 and also by various metal options. The oscillator (OSC) 174 is used to provide accurate timing for multilevel programming and sensing.

The input buffer 196 provides buffers for input/output with the memory array system 100. The input buffer 196 buffers an input/output line 197 coupled to an external circuit or system, and an input/output bus 194B, which couples to the arrays 101, 102, 104, and 106 through the y-drivers 110, 112, 114, and 116, respectively. In one embodiment, the input buffer 196 includes TTL input buffers or CMOS input buffers. In one embodiment, the input buffer 196 includes an output buffer with slew rate control or an output buffer with value feedback control. Input/output (IO) buffer blocks 194 includes typical input buffers and typical output buffers. A typical output buffer is, for example, an output buffer with slew rate control, or an output buffer with level feedback control. A circuit block 196R is an open drained output buffer and is used for ready busy handshake signal (R/RB) 196RB.

The voltage supply and regulator (VMULCKT) 190 provides regulated voltage values above or below the external power supply used for erase, program, read, and production tests. In one embodiment, the voltage supply and regulator 190 includes a charge pump or a voltage multiplier. The voltage multiplying regulator (VMULREG) 192 provides regulation for the regulator 190 for power efficiency and for transistor reliability such as to avoid various breakdown mechanisms.

The system 100 may execute various operations on the memories 101, 102, 104, and 106. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, similar to (with the addition of the top gate) the operations described in U.S. Pat. No. 6,282,145, incorporated herein by reference above.

Control signals (CONTROL SIGNALS) 196L, input/output bus (IO BUS) 194L, and ready busy signal (R/BB) 196RB are for communication with the system 100.

A flash power management circuit (FPMU) 198 manages power on-chip such as powering up only the circuit blocks in use. The flash power management circuit 198 also provides isolation between sensitive circuit blocks from the less sensitive circuit blocks by using different regulators for digital power (VDDD)/(VSSD), analog power (VDDA) (VSSA), and IO buffer power (VDDIO)/(VSSIO). The flash power management circuit 198 also provides better process reliability by stepping down power supply VDD to lower levels required by transistor oxide thickness. The flash power management circuit 198 allows the regulation to be optimized for each circuit type. For example, an open loop regulation could be used for digital power since highly accurate regulation is not required; and a closed loop regulation could be used for analog power since analog precision is normally required. The flash power management also enables creation of a "green" memory system since power is efficiently managed.

Figure 4:
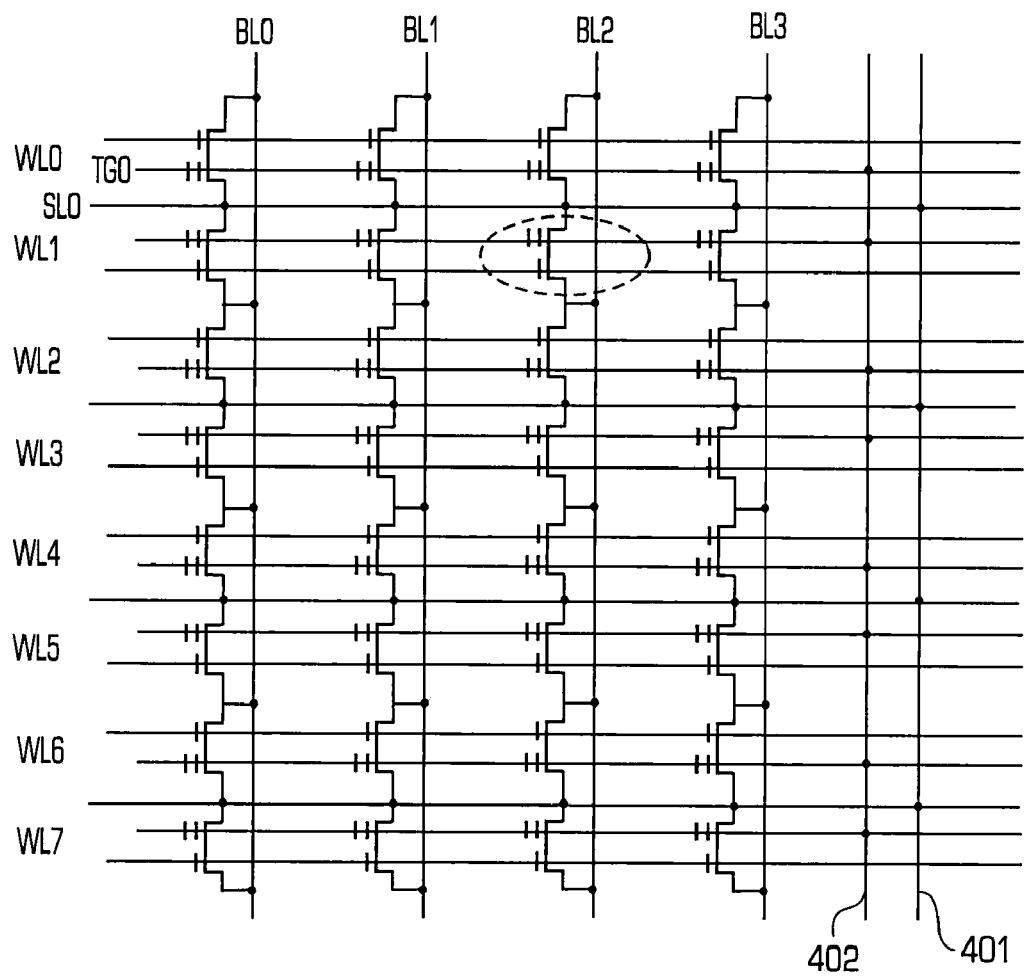
FIG. 4 is a schematic diagram illustrating a first embodiment of an array architecture of the memory system of FIG. 3.

FIG. 4 is a schematic diagram of a first embodiment of an array architecture. A segment of memory cells is shown in FIG. 4. In this embodiment, the source lines SL0 through SL7 are coupled to a common line 401. Thus, the source lines of this segment are coupled to each other. The top gate lines TG0 through TG7 are coupled to a common line 402. Thus, the top gate lines of a segment are coupled to each other. In this embodiment, the metallization includes eight lines for the word line, one line for the top gate terminals and one source line for a total of 10 metal lines. In this array architecture, the metallization organization is simpler than those of FIGS. 5 and 6. Also, the decoding circuitry may be simplified for the source line and the top gate because they are shared for the same segment. However, the programming disturbance may be worse due to when selected cells within a row are selected for programming, the unselected cells on other unselected rows are disturbed from the source line seeing the applied source line programming voltage and the top gate seeing the applied top gate programming voltage. In this array architecture, the loading on the top gate line 402 is heavy from driving all of (e.g., 8) top gates within the segment.

Figure 5:
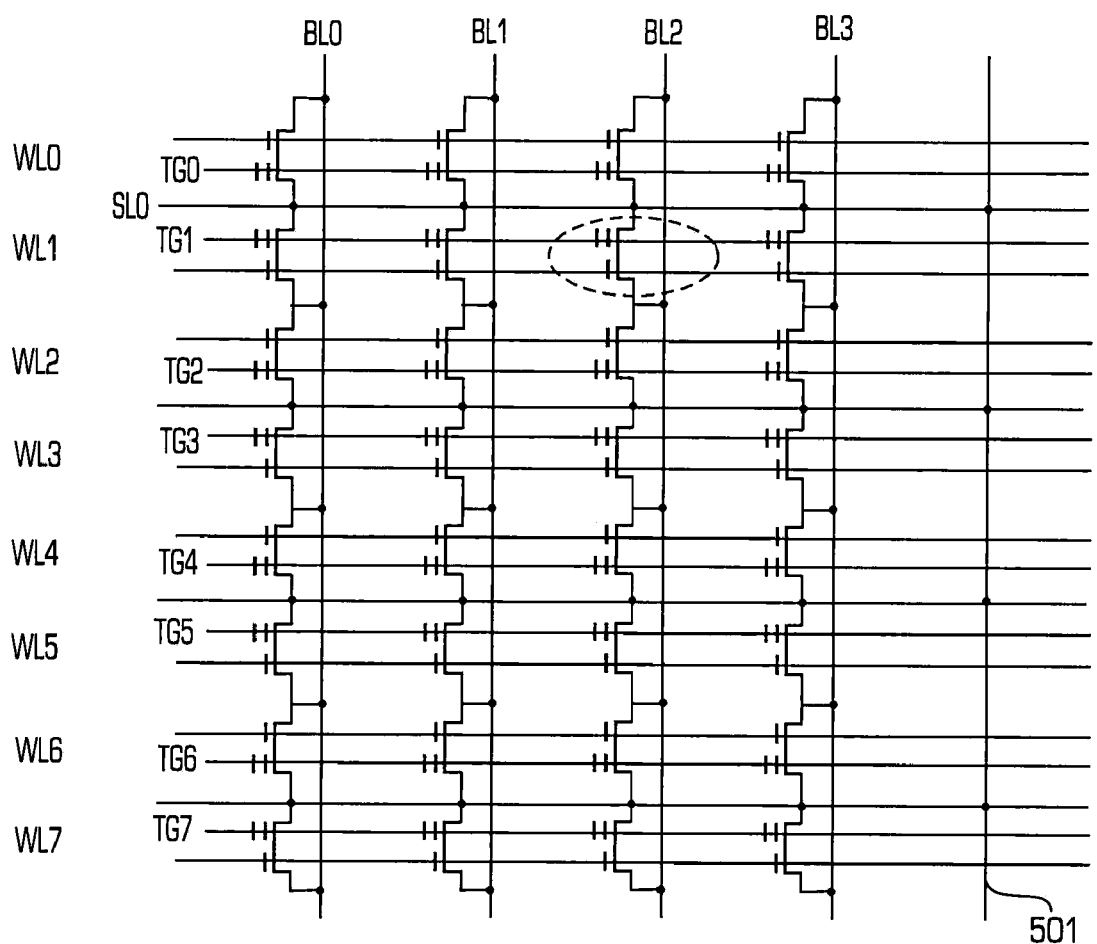
FIG. 5 is a schematic diagram illustrating a second embodiment of an array architecture of the memory system of FIG. 3.

FIG. 5 is a schematic diagram of a second embodiment of an array architecture. A segment of memory cells is shown in FIG. 5. In this embodiment, the source lines SL0 through SL7 are coupled to a common line 501. Thus, the source lines of this segment are coupled to each other. Unlike the array of FIG. 4, the top gate lines TG0 through TG7 are not coupled to each other. In this embodiment, the metallization includes eight lines for the word line, eight lines for the top gate terminals and one source line for a total of 17 metal lines. Here metallization organization is more complicated. However due to individual selection of the top gate lines, disturb is better than that of FIG. 4. due to unselected cells in unselected rows do not see applied top gate programming voltage for the selected cells. In this architecture, individual top gate lines only see individual loading, and not all top gate loading within the segment. Further, an individual top gate instead of a word line may be used to select or deselect the memory cells in read or programming; in this instance, all word lines may be further connected together for the same segment, then an individual top gate is used to select or deselect the row in program or read.

Figure 6:
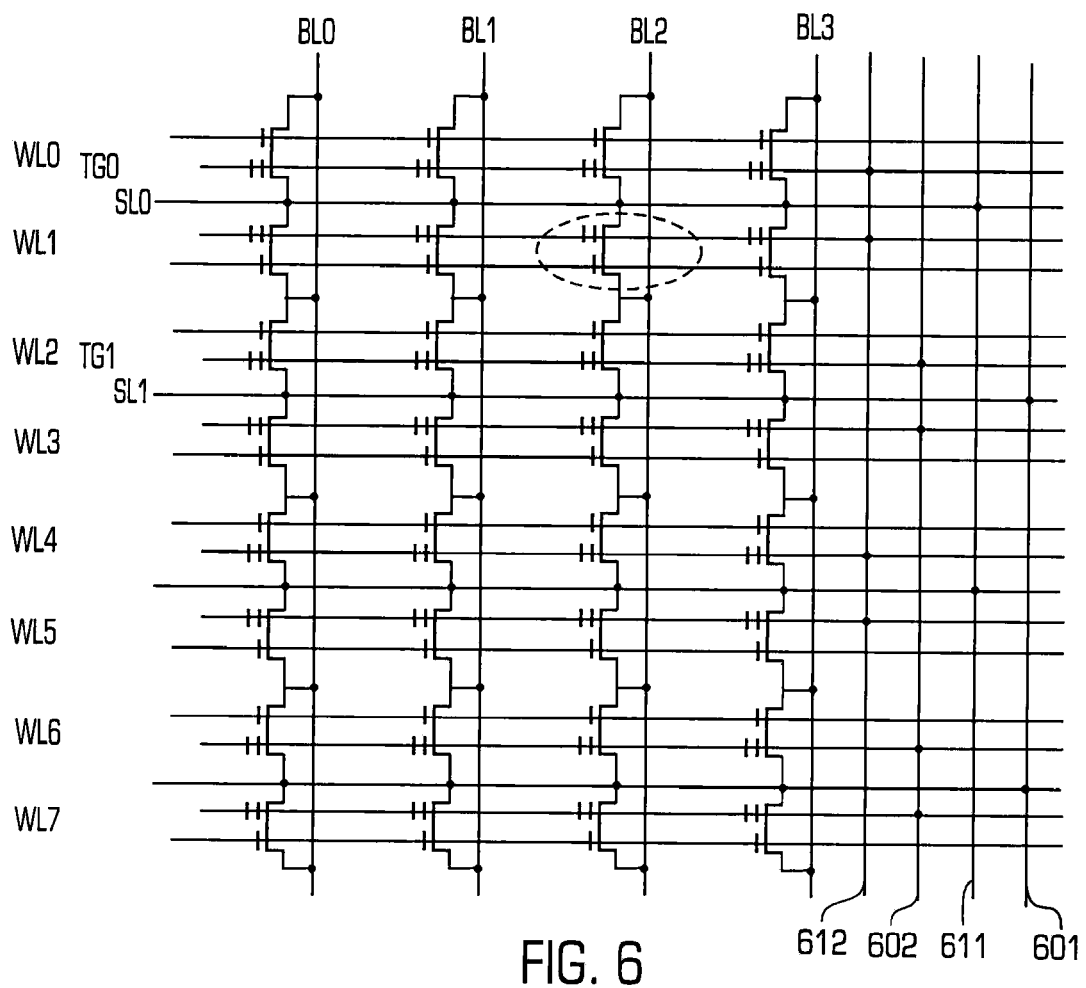
FIG. 6 is a schematic diagram illustrating a third embodiment of an array architecture of the memory system of FIG. 3.

FIG. 6 is a schematic diagram of a third embodiment of an array architecture. A segment of memory cells is shown in FIG. 6. In this embodiment, some of the source lines SL0 through SL7 are coupled to a common line 601 and others are coupled to a common line 611. Some of the top gate lines TG0 through TG7 are coupled to a common line 602 and other of the top gate lines are coupled to a common line 612. In this embodiment, the source lines for odd memory cells are tied together and the source lines for even memory cells are tied together. The top gates of odd memory cells are tied together and the top gate of even memory cells are tied together. In this embodiment, the metallization includes eight word lines, four top gate lines and two source lines for a total of 14 metal lines. In this architecture, the disturbance is reduced by separating the top gates into two halves and the source lines into two halves interleaved into two top gate halves. When one half is selected, the other half is deselected. The loading for top gates is separated into two. Other alternative odd/even or more numbers of group arrangement may be made.

The embodiment of FIG. 5 may have the least disturbance between switching of memory cells, the embodiment of FIG. 4 may have the worst disturbance but has less metal, and the embodiment of FIG. 6 may have less disturbance but more metal.

FIG. 7 is a table illustrating operating voltages for array operation of the array of FIG. 3. The table of FIG. 7 shows the operating voltages for selected and unselected segments of the array during erase, programming, and read operations. In an illustrative example of an erase, word lines WL0, 2-7, a source line SL0, and bitlines BL0 through BL7 are set equal to 0 volts for the selected segment. For the unselected segments, the word lines WL8-N, the source lines SL1-N and the bitlines BLx-N are set equal to 0. The erase voltage VER for a word line WL1 may be set equal to 11.5 volts and the top gate erase voltage VTGE of the top gate TG0 may be set equal to 0. In another example, the erase voltage VER is set equal to 5 volts and the top gate erase voltage is set equal to –10 volts. The top gate voltage VTGUNSEL of unselected segments is set to the supplied voltage VDD, ground, or negative. In an illustrative example of a program operation, the word line programming voltage VWLP of the word line WL1 is set approximately to 1.5 volts, the top gate program voltage VTGP of the top gate TG0 is set to approximately 10 volts, the source line programming voltage VSLP of the source line SL0 of the selected segment is set to approximately 5 volts, and the bitline inhibit voltage VBLINH of the other bitlines is set to the supply voltage VDD. In an illustrative example for read operation, the word line read voltage VWLRD of the word line WL1 is set to the supply voltage VDD, the top gate read voltage VTGRD of the top gate TG0 is set to the supply voltage VDD.

The array operation may be done without real time read switching for the top gate. All the gates may be in a standby mode with a voltage VTGRD that is approximately the supply voltage in a standby mode, or alternatively ground. As described below, the system provides a method for handling defective top gates. In one such embodiment, the standby current, or a leakage current, may be used to detect defective top gates. The system also provides handling of capacitive coupling between top gates and word lines.

Figure 8:
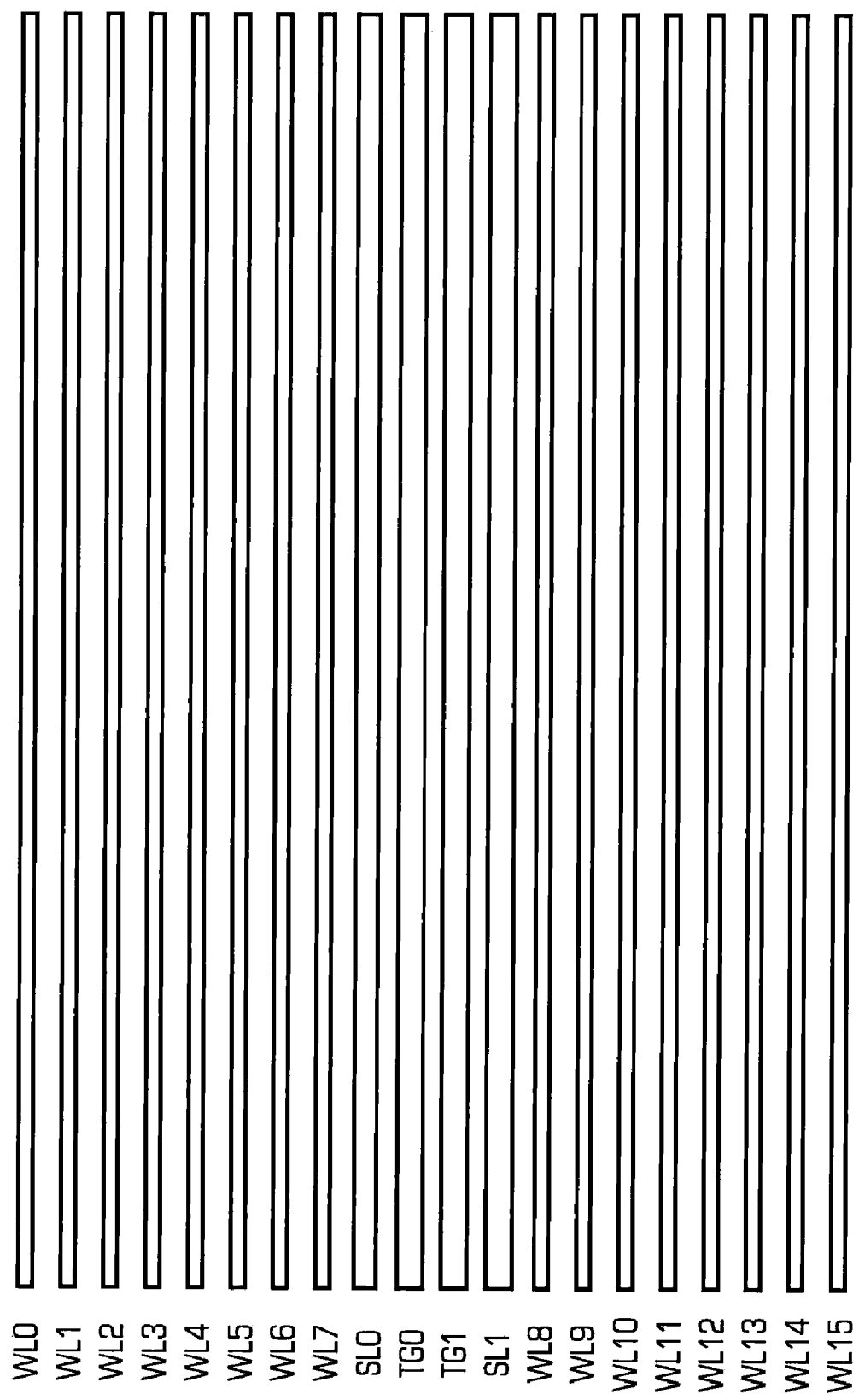
FIG. 8 is a top plan view illustrating the metallization for an array sector.

FIG. 8 is a top plan view illustrating the metallization for an array sector.

In an illustrative example, the top gate lines TG0 and TG1 are disposed as parallel metallization lines. The metallization of the source line SL0 and a plurality of word lines WL7 through WL0 are disposed on one side of and parallel to the top gate line TG0. In a similar manner, a source line SL1 and a plurality of word lines WL8 through WL15 are disposed on another side of and parallel to the top gate line TG1. Alternatively other arrangements, e.g., TG0,WL0-3, SL0, WL4-7, TG1,WL8-11,SL1, and WL-12-15, are possible.

Figure 9:
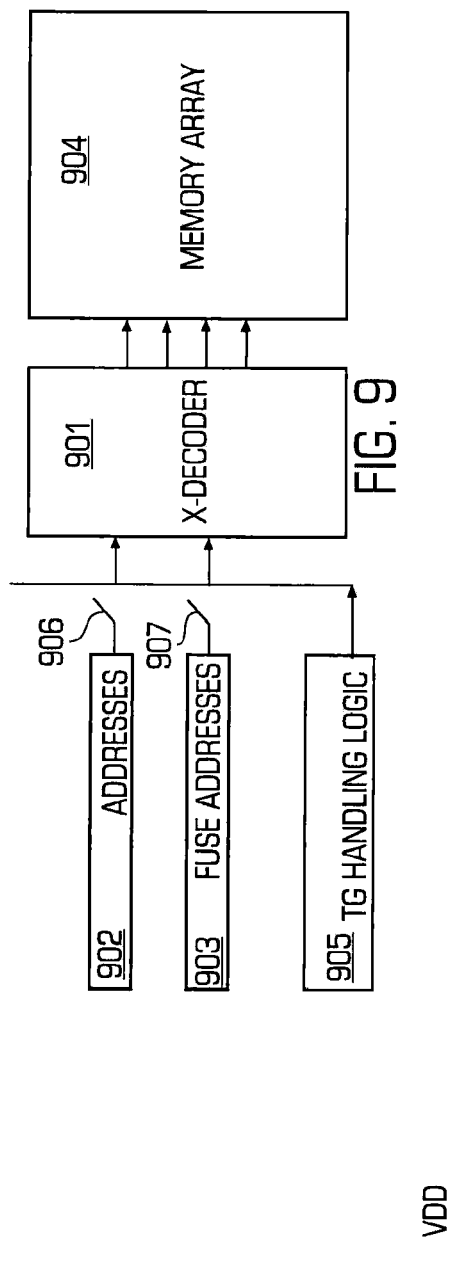
FIG. 9 is a block diagram illustrating a portion of the memory system of FIG. 3.

FIG. 9 is a block diagram illustrating a portion of the memory system of FIG. 3. An x-decoder 901 decodes addresses 902 or fuse addresses 903 and selects corresponding memory cells in the memory array 904. A top gate handling logic circuit 905 controls switches 906 and 907 for coupling the addresses 902 and fuse addresses 903, respectively, to the x-decoder 901.

Figure 10:
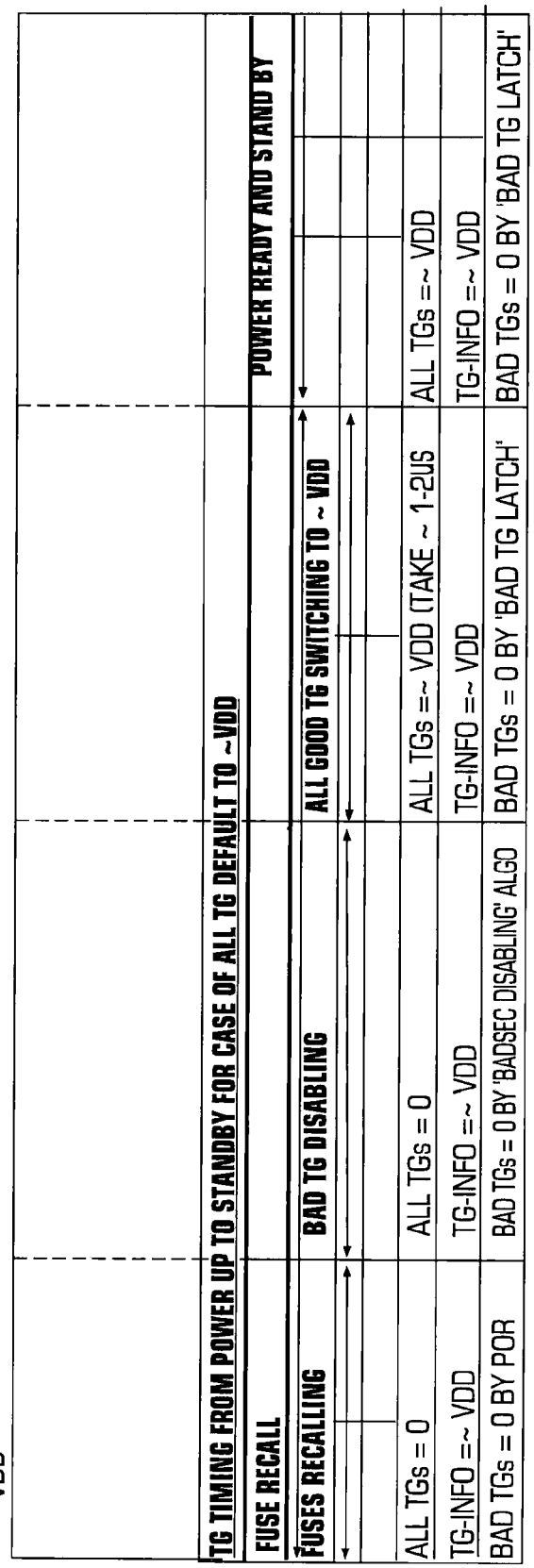
FIG. 10 is a timing diagram illustrating the operation of the top gate control timing of the memory system of FIG. 9.

FIG. 10 is a timing diagram illustrating the operation of the top gate control timing of the top gate handling logic circuit 905.

The timing of the top gate control is divided into two time intervals; a fuse recall period, and a power ready and standby period. During the fuse recall period the system has three sub-periods: fuse recalling; bad top gate disabling; and good top gate enabling. In the fuse recall period, an information row or sector is read with the top gates of the sector being set to a supply voltage VDD or a fixed bias voltage, and the other top gates are set to zero. The power on reset (POR) sets the top gates of bad cells also to zero. The information row is used to determine functional or operational parameters for the product initialization. In the bad top gate disabling sub period, the latches, which are described below, are used to disable the bad top gates by a bad sector disabling procedure. The top gate voltage is set to zero for all top gates. The voltage of the top gate of the information row is set to the supply voltage VDD or a fixed bias voltage. The bad top gates have an applied voltage of zero to disable the bad top gate using the bad sector disabling procedure. In the good top gate enabling sub period, the good top gates are enabled. After disabling the bad top gates, the top gates of all the good cells are switched to the supply voltage VDD or a fixed bias voltage. The voltage on the top gates of the information row are set to the supply voltage VDD or a fixed bias voltage. The voltage of the bad top gates are set to zero by a bad top gate latch. In the power ready and standby period, the bad top gates are set to zero by the bad top gate latch. The top gates of the other cells and of the information row are set to the supply voltage VDD.

Figure 11:
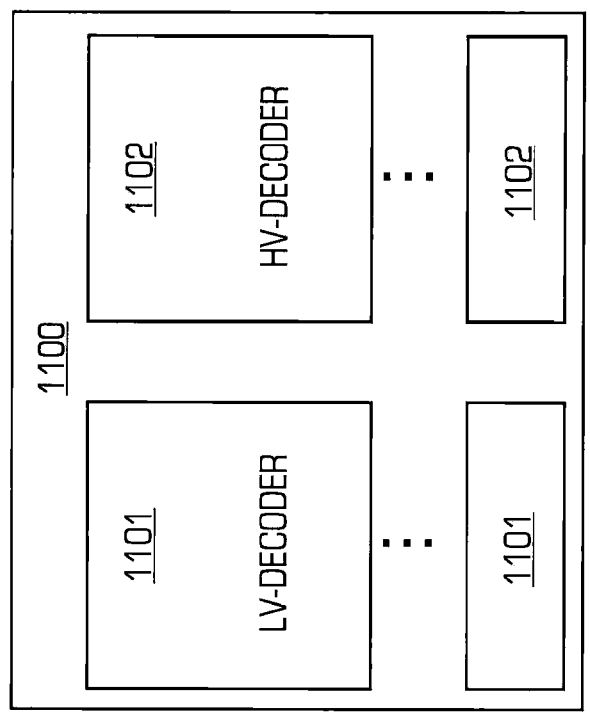
FIG. 11 is a block diagram illustrating a top gate control circuit of the memory system of FIG. 9.

FIG. 11 is a block diagram illustrating a top gate control circuit 1100.

Figure 15:
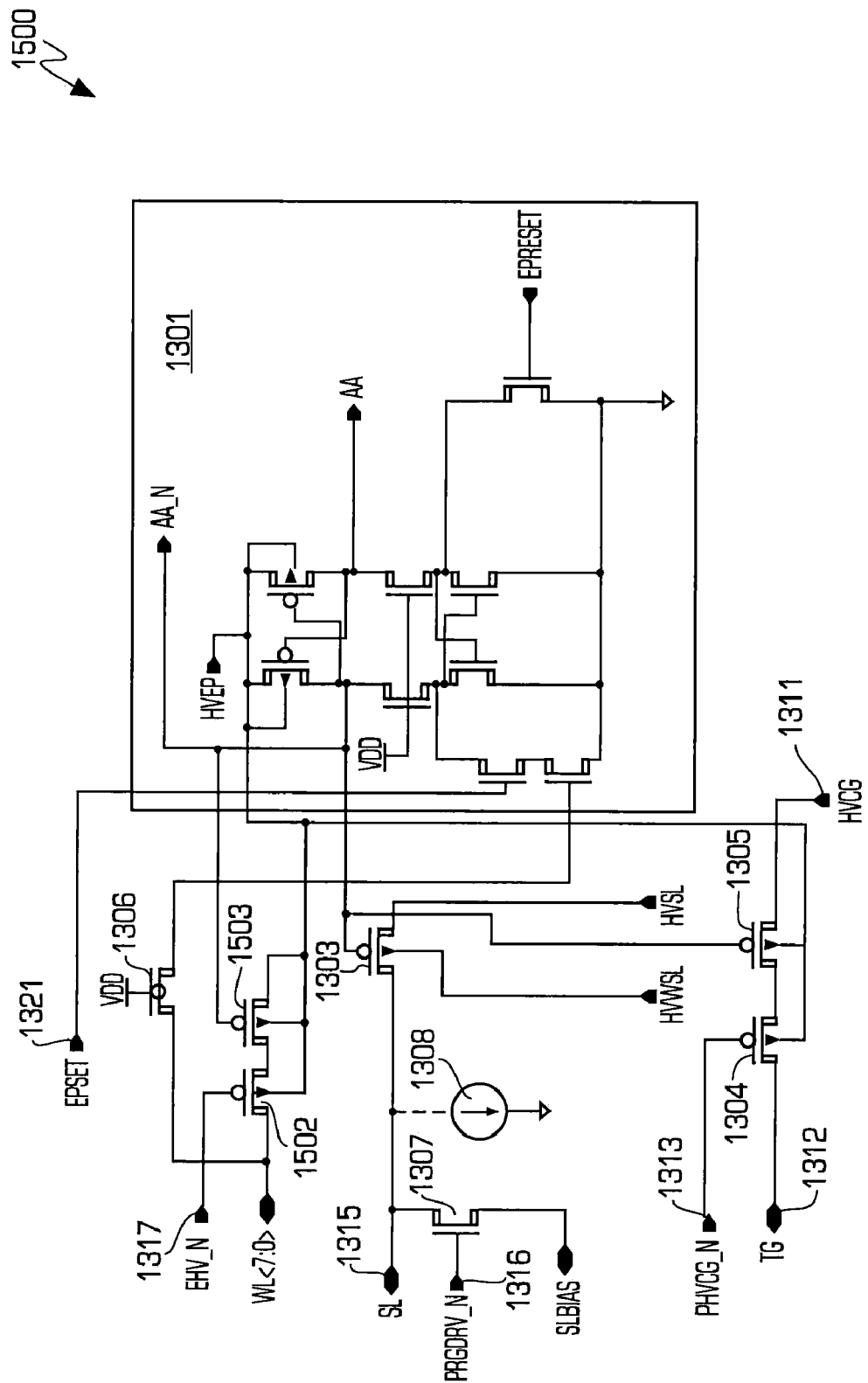
FIG. 15 is a schematic diagram illustrating a second embodiment of a high voltage decoder circuit of the top gate control circuit of FIG. 11.
Figure 16:
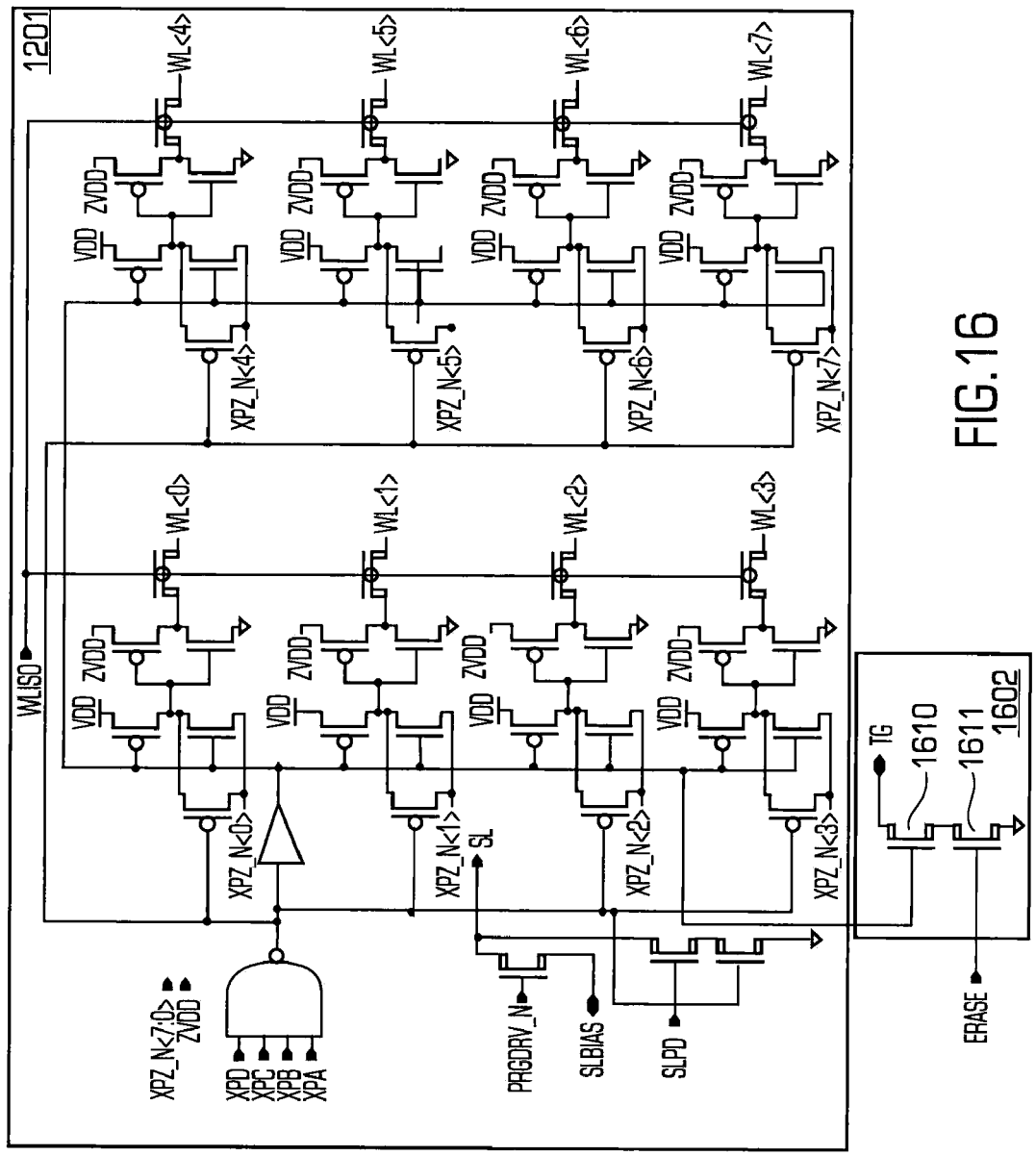
FIG. 16 is a schematic diagram illustrating a third embodiment of a low voltage decoder circuit of the top gate control circuit of FIG. 11.
Figure 17:
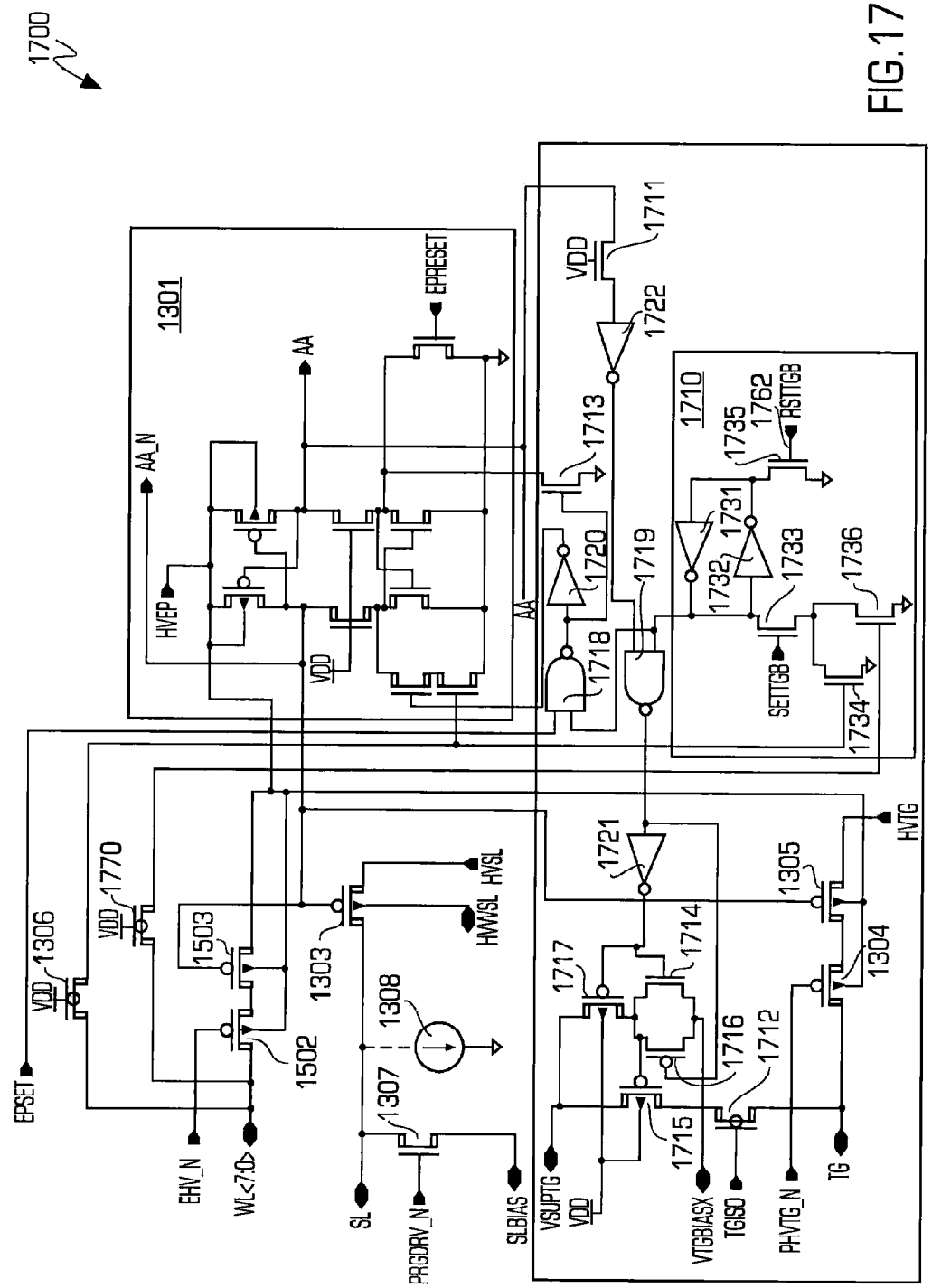
FIG. 17 is a schematic diagram illustrating a third embodiment of a high voltage decoder circuit of the top gate control circuit of FIG. 11.
Figure 18:
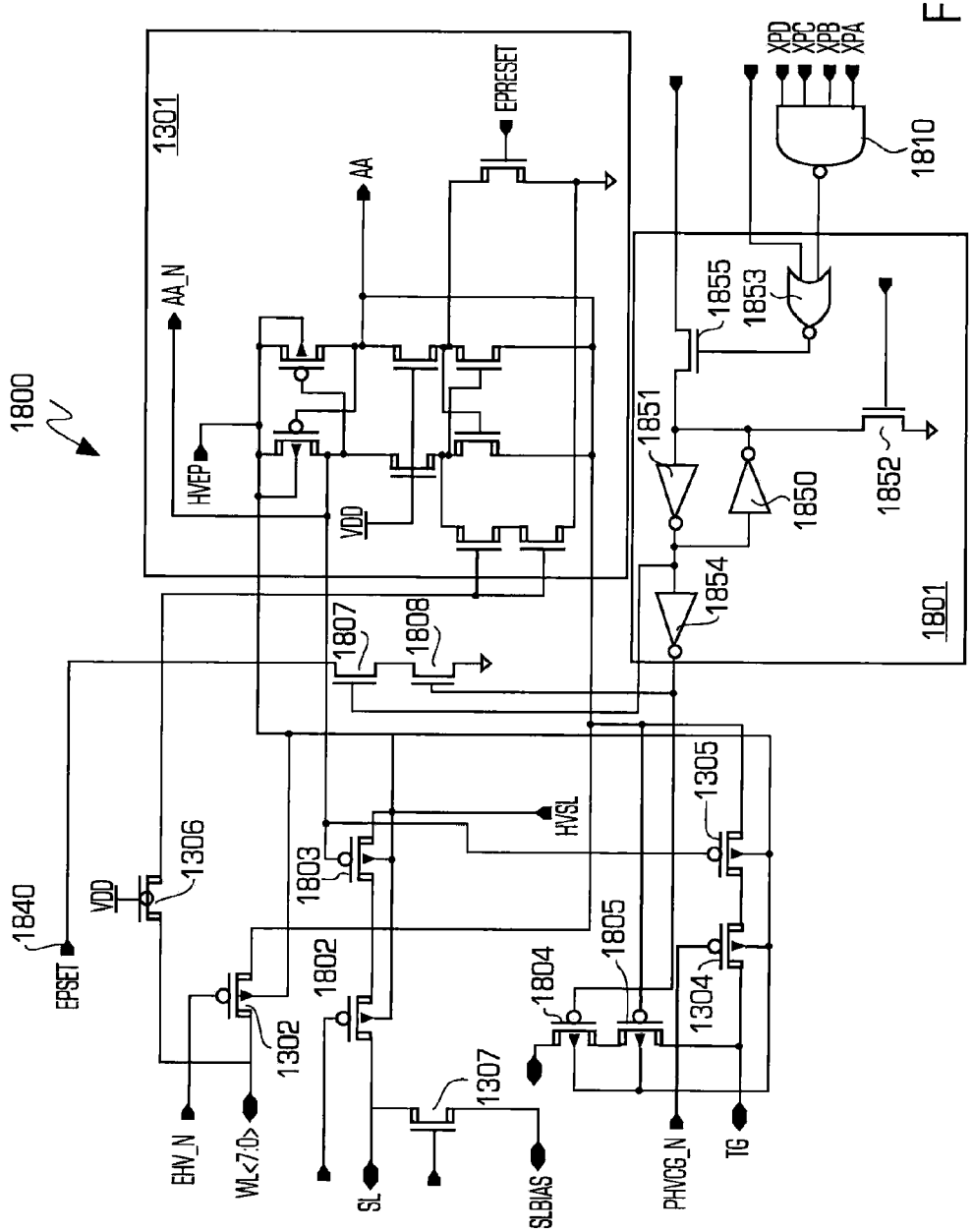
FIG. 18 is a schematic diagram illustrating a fourth embodiment of a high voltage decoder circuit of the top gate control circuit of FIG. 11.

The top gate control circuit 1100 may be part of the x-decoder 901 (FIG. 9). The top gate control circuit 1100 comprises a plurality of low voltage decoder circuits 1101 and a plurality of high voltage decoder circuits 1102. In one embodiment, one of the low voltage decoder circuits 1101 and one of the high voltage decoder circuits 1102 apply voltage signals to a sector of memory cells of the memory array 904 (FIG. 9) in response to decoded address signals for the sector. The low voltage decoder circuit 1101 applies low voltage signals to the word lines in response to decoded address signals. The high voltage decoder circuit 1102 applies high voltage signals to the word lines, source lines and top gates in response to decoded address signals. In one embodiment, the top gate control circuit 1100 comprises a low voltage decoder circuit 1101 that includes a low voltage decoder circuit 1200 (FIG. 12) and the high voltage decoder 1102 includes a high voltage decoder 1300 (FIG. 13). In another embodiment, the top gate control circuit 1100 comprises a low voltage decoder 1101 that includes a low voltage decoder 1400 (FIG. 14) and the high voltage decoder 1102 includes a high voltage decoder 1500 (FIG. 15). In yet another embodiment, the top gate controller circuit 1100 comprises a low voltage decoder 1101 that includes a low voltage decoder circuit 1600 (FIG. 16) and the high voltage decoder 1102 includes a high voltage decoder 1700 (FIG. 17). In yet another embodiment, the high voltage decoder 1102 may include a high voltage decoder 1800 (FIG. 18). Alternatively, the low voltage decoder 1101 and the high voltage decoder 1102 may be combined together into a mixed (low voltage and high voltage) voltage decoder.

Figure 12:
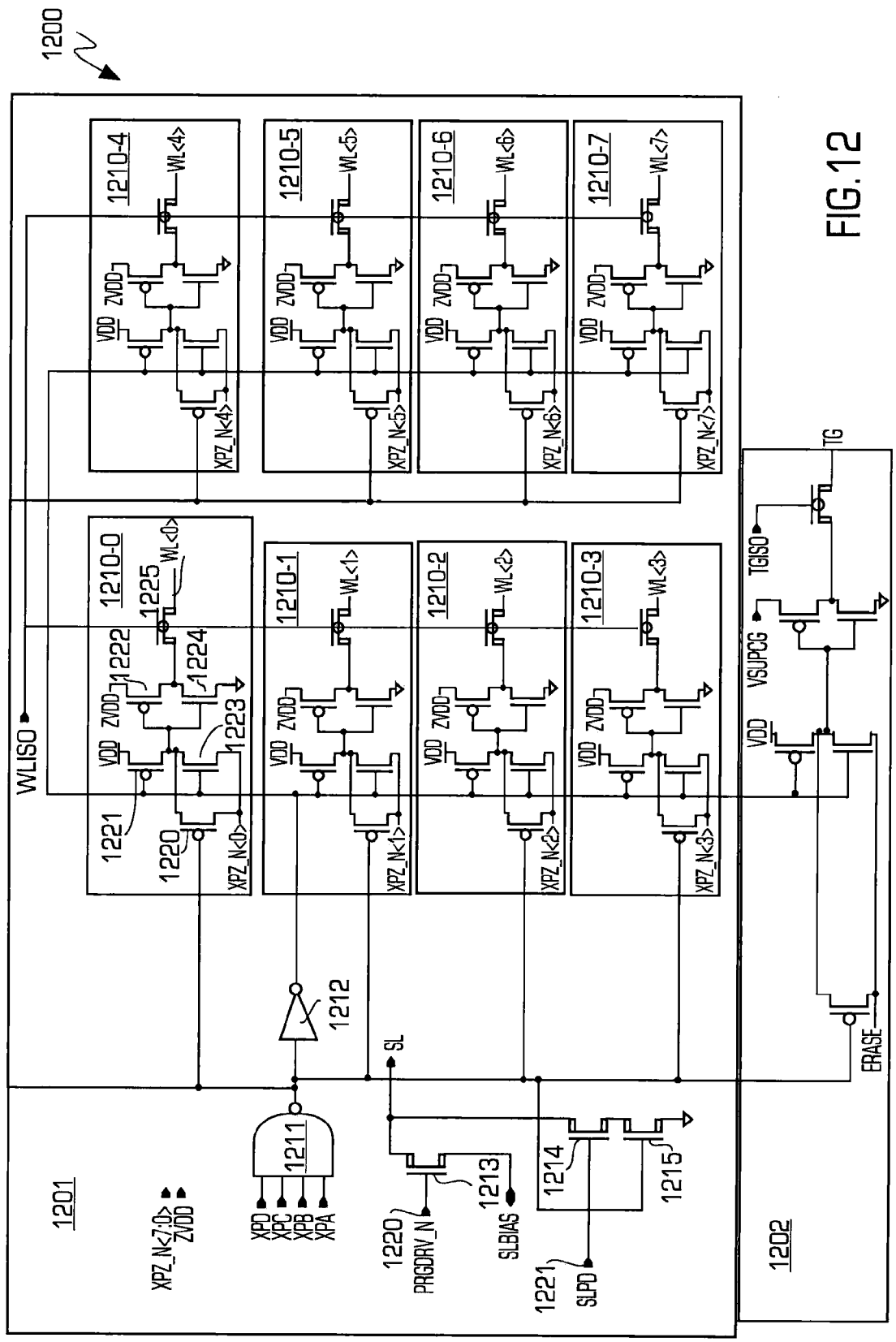
FIG. 12 is a schematic diagram illustrating a first embodiment of a low voltage decoder circuit of the top gate control circuit of FIG. 11.
Figure 13:
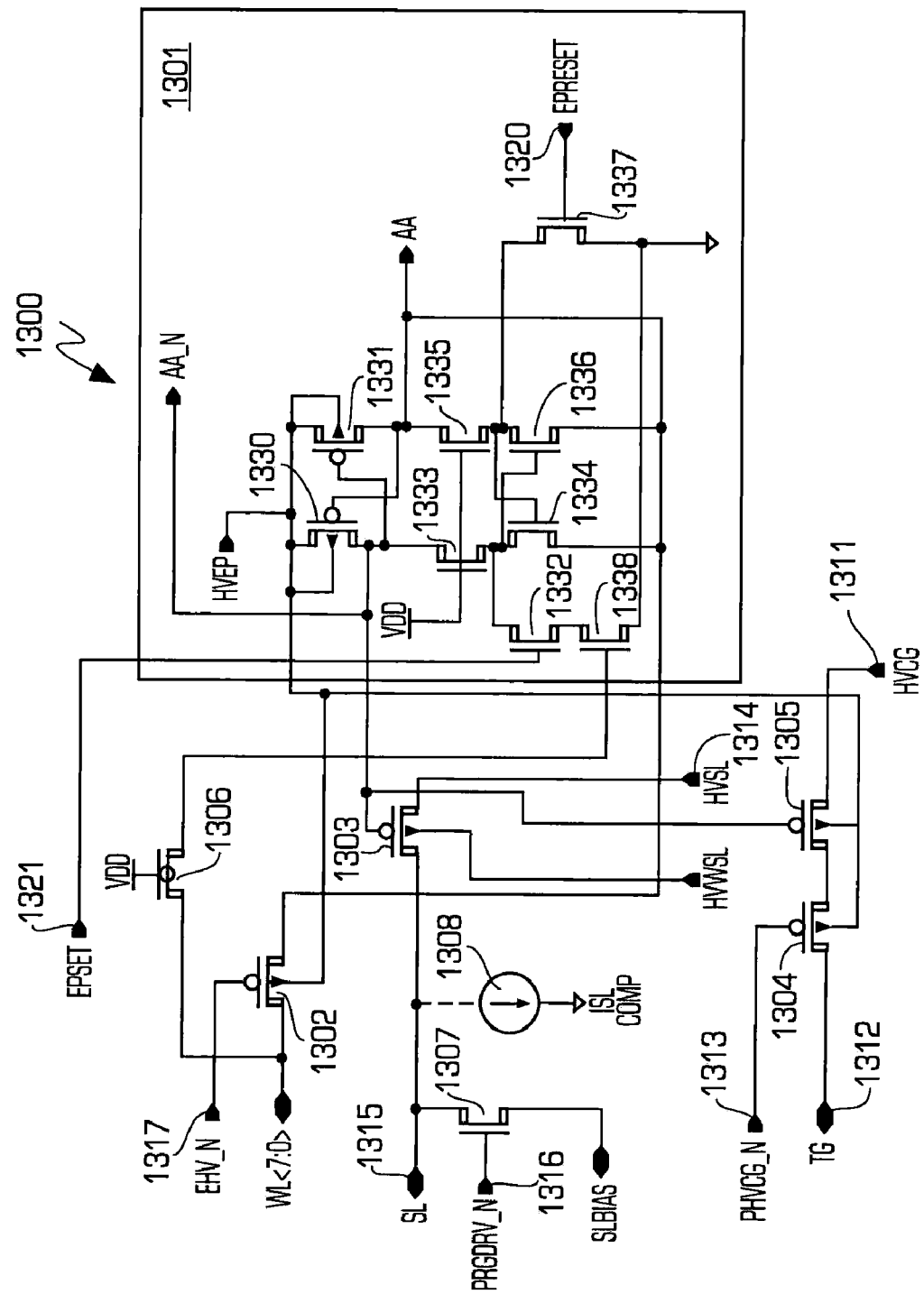
FIG. 13 is a schematic diagram illustrating a first embodiment of a high voltage decoder circuit of the top gate control circuit of FIG. 11.

FIG. 12 is a schematic diagram illustrating the low voltage decoder circuit 1200.

The low voltage decoder circuit 1200 applies low voltage signals to the word lines and top gate of a sector of the memory array. The low voltage decoder circuit 1200 comprises a decoder 1201 and a decoder 1202. The decoder 1201 provides a select signal on the Word Lines WL0-WL7. The decoder 1202 provides a select signal on the top gate (TG). The decoder circuit 1200 does not include a top gate latch, which is included in the low voltage decoder circuit 1400 (FIG. 14) and the low voltage decoder circuit 1600 (FIG. 16). The decoder circuit 1201 comprises a plurality of control circuits 1210-1210-7, a NAND gate 1211, and an inverter 1212, and a plurality of NMOS transistors 1213, 1214 and 1215. In response to address signals XPA-XPD, the NAND gate 1211 and the inverter 1212 decode the selected addresses for enabling the control circuits 1210 to apply control signals to selected word lines. In one embodiment, the sector of memory cells corresponding to the decoder circuit 1200 is controlled by signal lines, e.g., 8 lines, of predecoded address signals. The control circuit 1210 comprises a plurality of PMOS transistors 1220, 1221 and 1222, a plurality of native NMOS transistors 1223 and 1224 and a NH NMOS transistor 1225. (For simplicity and clarity, only the reference numbers of the control circuit 1210-0 are shown in FIG. 12.) The top gate control circuit 1202 includes MOS transistors arranged in a simple manner as the control circuits 1210. The top gate circuit 1202 provides select signals on the top gate in response to the decoded address from the NAND decoder 1211 and provides the select signal in response to an erase signal. The low voltage decoder circuit 1200 provides low voltage signals to a source line for a sector. The NH NMOS transistor 1213 couples a source line bias (SLBIAS) to the source line in response to a program drive (PRGDRV-N) signal 1220. The NH NMOS transistors 1214 and 1215 selectively couple the source line to ground in response to a source line power down (SLPD) signal 1221 and the decoded address from the NAND gate 1211.

FIG. 13 is a schematic diagram illustrating a high voltage control circuit 1300.

The high voltage control circuit 1300 comprises a high voltage latch 1301, a plurality of PMOS transistors 1302, 1303, 1304, and 1305, an NMOS transistor 1306, a NH NMOS transistor 1307, and a source line compensation current source 1308. The high voltage latch 1301 controls the application of high voltages to the word line and the source line based on whether the top gate is defective for the sector. The high voltage latch 1301 controls the application of the high voltage 1311 to a top gate voltage line 1312 by enabling the PMOS transistor 1305, which operates as a pass gate during programming. The PMOS transistor 1304 controls the application of the high voltage signal 1311 to a top gate voltage line 1312 in response to a programming high voltage signal 1313. The PMOS transistor 1304 may also act as a current limiter. The high voltage latch 1301 also enables the PMOS transistor 1303 which provides a high voltage signal 1314 to the source line 1315 during programming. In one embodiment, the high voltage latch 1301 has a "disabled" default state, The NH NMOS transistor 1307 provides a source line bias to the source line 1315 in response to a programming driver signal 1316. The PMOS transistor 1302 provides high voltage to the word line during erase and may also act to limit current on the word line during erase in response to a high voltage enable signal 1317.

The source line compensation current source 1308 provides compensation on the source line 1315. This compensation may be to compensate for the data pattern on the source line during programming. During a normal 16-bit programming, the source line of the 16 bits are enabled but at other times a fewer number of bits, for example 2-4 bits, may be enabled. This results in a different current flow which can be compensated by the source line compensation current source 1308 which may replicate the 16 bits on the source line.

The high voltage latch 1301 comprises a plurality of PMOS transistors 1330 and 1331, and a plurality of NH NMOS transistors 1333, 1334, 1335, and 1336 that are arranged as a latch. The high voltage latch 1301 further comprises a NH NMOS transistor 1337 that operates to disable the latch 1301 in response to a reset signal 1320. The latch 1301 further comprises NH NMOS transistor 1332, which is enabled by a set signal 1321, and an NH NMOS transistor 1338, which is enabled by the signal on the word line. The NH NMOS transistors 1332 and 1338 operate to enable the latch 1301.

Figure 14:
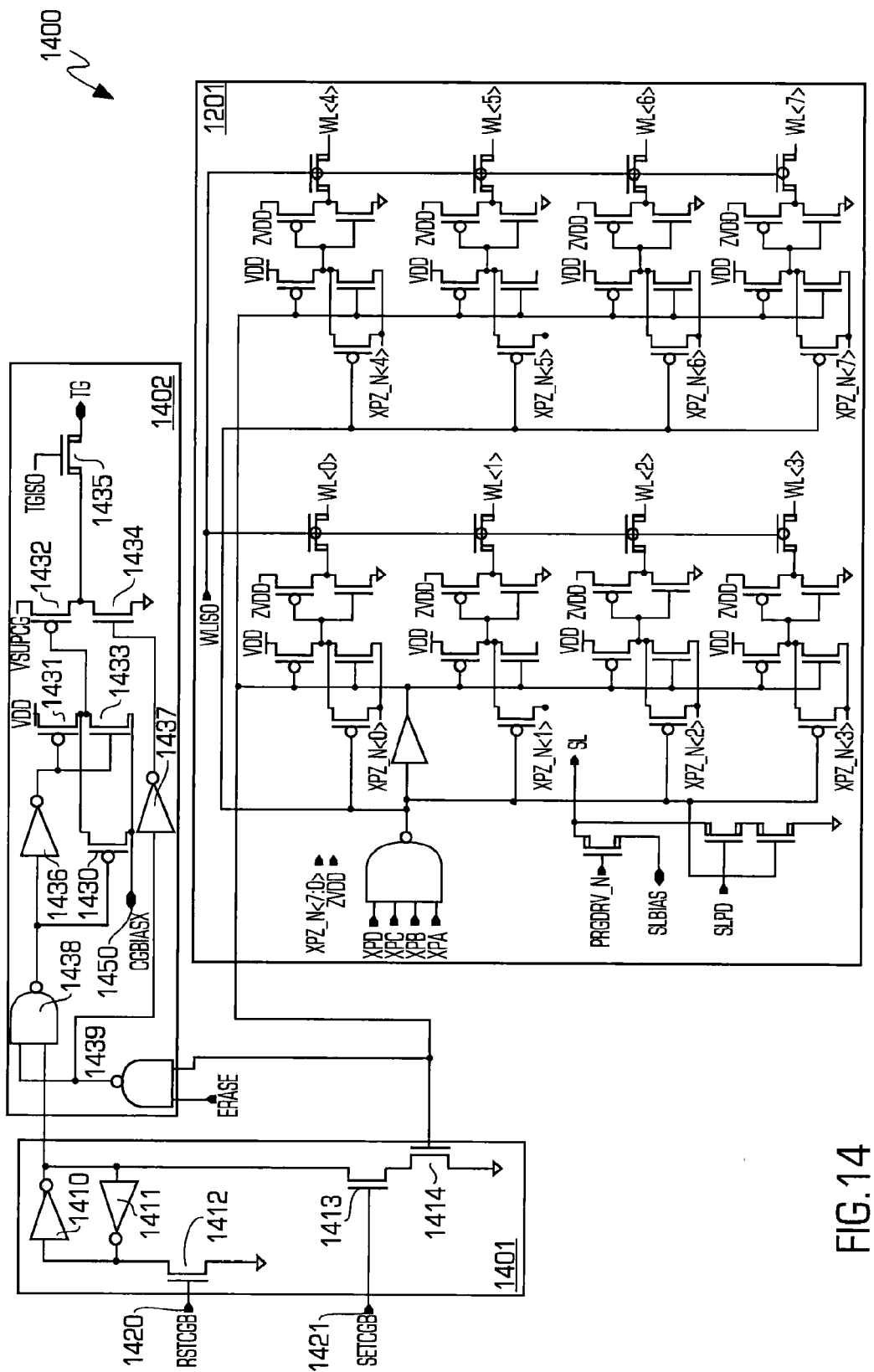
FIG. 14 is a schematic diagram illustrating a second embodiment of a low voltage decoder circuit of the top gate control circuit of FIG. 11.

FIG. 14 is a schematic diagram illustrating the low voltage decoder circuit 1400.

The low voltage decoder circuit 1400 comprises a low voltage decoder 1201, a latch 1401, and a top gate decoder circuit 1402. The latch 1401 controls the enabling and disabling of the top gate decoder circuit 1402 in the event that a top gate of one of the memory cells of the sector is defective. In one embodiment, the default state of the top gate latch 1401 is in an enable state to enable the top gate decoder circuit 1402. In a set state, the top gate latch 1401 disables the top gate decoder circuit 1402. In one embodiment the disabling is based on a bad top gate or memory cell.

The top gate latch 1401 comprises a plurality of inverters 1410 and 1411 arranged as a latch, and a plurality of NMOS transistors 1412, 1413, and 1414. The NMOS transistor 1412 is used to reset the state of the latch formed of the inverters 1410 and 1411 in response to a reset signal 1420. The NMOS transistor 1413 together with the NMOS transistor 1416 sets the latch formed of the inverters 1410 and 1411 in response to a set signal 1421. The NMOS transistor 1414 together with the NMOS transistor 1413 sets the state of the latch in response to an address from the NAND gate 1211 and the inverter 1212 of the low voltage decoder 1201 (FIG. 12).

The top gate decoder circuit 1402 comprises a plurality of PMOS transistors 1430, 1431, and 1432 and a plurality of NMOS transistors 1433, 1434 and 1435 arranged in a similar manner as the top gate decoder circuit 1202 of the low voltage decoder circuit 1201 (FIG. 12), but the drain of the PMOS transistor 1430 and the source of the NMOS transistor 1433 are coupled to a top gate bias signal 1450 instead of an erase signal, and the gate of the NMOS transistor 1434 is controlled by a NAND gate 1439 and an inverter 1437 in response to an erase signal and the address signal from the inverter 1212. The top gate control circuit 1402 further comprises an inverter 1436 and a NAND gate 1438 to control the enabling of the PMOS transistors 1430 and 1431 and the NMOS transistor 1433 in response to the enabling by the top gate latch 1401 and by the erase and address signal control of the NAND gate 1439. In this embodiment, the top gate latch 1401 shares decoding with the low voltage decoder circuit 1201 and the top gate control circuit 1402.

FIG. 15 is a schematic diagram illustrating a high voltage decoder circuit 1500.

The high voltage decoder circuit 1500 is similar to the high voltage decoder circuit 1300 (FIG. 13), but further comprises PMOS transistors 1502 and 1503 instead of a PMOS transistor 1302. The PMOS transistor 1502 is controlled in a similar manner as the PMOS transistor 1302 of the high voltage decoder circuit 1300. The PMOS transistor 1503 may provide further current limiting on the word line. The PMOS transistor 1502 and 1503 provide high voltage to the word line from the high voltage supply HVEP coupled to their channel.

FIG. 16 is a schematic diagram illustrating the low voltage decoder circuit 1600.

The low voltage decoder circuit 1600 comprises a low voltage decoder circuit 1201 and a top gate decoder circuit 1602. The top gate decoder circuit 1602 may select or deselect the top gate. The top gate decoder circuit 1602 comprises a plurality of NH NMOS transistor 1610 and 1611 coupled in the series between the top gate line and ground. The address decoder NAND 1211 and the inverter 1212 of the decoder circuit 1201 enable the NH NMOS transistor 1610. An erase signal enables the NH NMOS transistor 1611.

FIG. 17 is a schematic diagram illustrating the high voltage decoder circuit 1700.

The high voltage decoder circuit 1700 is similar to the high voltage decoder circuit 1500, but further comprises a latch circuit 1701. The latch circuit 1701 is similar to the latch of the low voltage circuit 1400. The latch circuit 1701 comprises a latch 1301, a latch 1710, a plurality of NH NMOS transistors 1711, 1712 and 1713, an NMOS transistor 1714, a plurality of PMOS transistors 1715, 1716 and 1717, a plurality of NAND gate 1718 and 1719, and a plurality of inverters 1720, 1721, and 1722. The latch 1301 is controlled by the NAND gate 1718, the inverter 1720 and the NH NMOS transistor 1713 in response to a set signal 1751. The latch 1710 provides a disable signal to the NAND gate 1718 in the event of a defective top gate to disable the top gate line. The NAND gate 1719, the inverter 1721, and the transistors 1712, 1714, 1715, 1716, and 1717 control the level of the top gate line in response to the latch 1710. In another embodiment, the supply voltage VDD may be set as a default in certain circumstances for the top gate level. The latch 1710 comprises a plurality of inverters 1731 and 1732 arranged in a latch configuration. The latch 1710 further comprises a plurality of NMOS transistors 1733, 1734, 1735 and 1736 for setting and resetting the latch formed of the inverter 1731 and 1732. The NMOS transistor 1735 resets the latch 1710 in response to a reset signal 1760. In response to a set signal 1761, the transistor 1733 sets the latch in the event that the transistor 1734 and 1736 are enabled by the word lines through the transistor 1306 and a transistor 1770. In this embodiment, two word lines are used for setting the top gate latch 1710 in the event there is a defect in one of the word lines. In another embodiment, multiple or different combinations of word lines may be used such as an odd, even, or odd and even word lines.

FIG. 18 is a schematic diagram illustrating a high voltage decoder circuit 1800.

The high voltage decoder circuit 1800 uses address decoding for latching the top gate control. The high voltage decoder circuit 1800 comprises a top gate latch 1301, a plurality of PMOS transistors 1302, 1304, a plurality of NH NMOS transistors 1306 and 1307, and a top gate latch 1801. The transistors 1302, 1304, 1305, 1306, 1307 are arranged in a similar manner as in the high voltage decoder circuit 1300. The high voltage decoder circuit 1800 further comprises a plurality of PMOS transistors 1804 and 1805 for latching the voltage on the top gate in response to the top gate latch 1801. The PMOS transistors 1802 and 1803 serve to provide a medium high voltage and may act as a current limiter on the source line. The NMOS transistors 1807 and 1808 control the setting of the latch 1301 in response to a set signal 1840. The high voltage decoder circuit 1800 further comprises a NAND gate 1810 that sets the top gate latch in response to address decoding signals. The top gate latch 1801 comprises a plurality of inverters 1850 and 1851 arranged as a latch, an NMOS transistor 1852 for resetting the latch, an NOR gate 1853, an output inverter 1854 and an NMOS transistor 1855. The NMOS transistor 1855 sets the state of the top gate latch in response to the NOR of the output of the NAND gate 1810 and a set signal that are set by the NOR gate 1853.

Figure 19A:
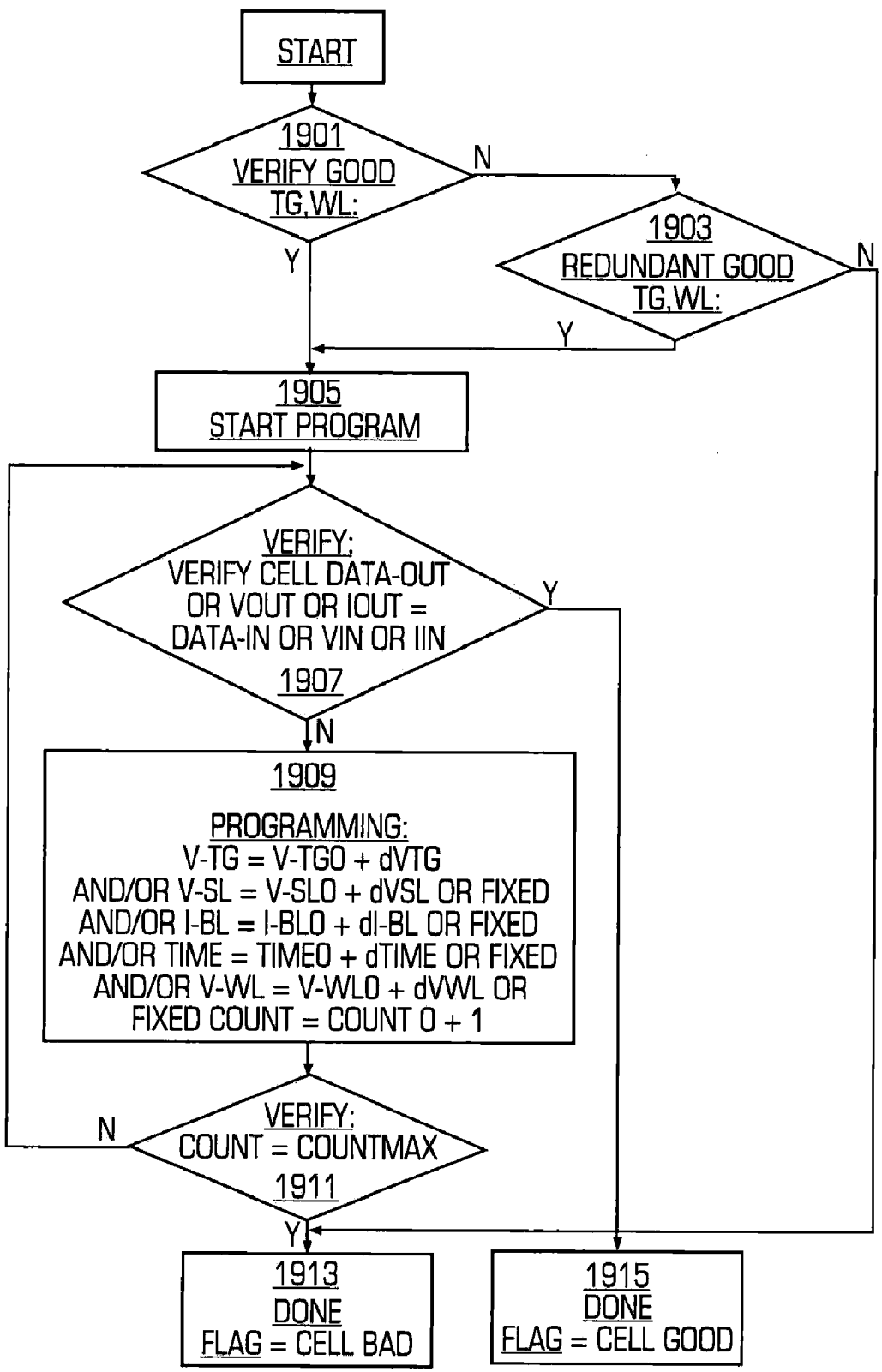
FIG. 19A is a flowchart illustrating the operation of the top gate handling logic circuit of FIG. 9.

FIG. 19A is a flowchart illustrating the programming operation for the top gate memory cell.

First the top gate and word line of the selected memory cells are verified to be good or bad (block 1901). If they are good, then a programming operation may start (block 1905). If either one is bad, then the availability of a replacement redundant TG,WL is sought (block 1903). If it is, then the programming may start (block 1905). If it is not, then the operation stops and a bad flag is set (block 1913). After programming starts (block 1905), the cell is verified (block 1907) by, for example, comparing the data output, voltage output or current output to the data input, voltage input, or current input, respectively. If the verify is correct, the flag is set that the cell is good (block 1915). On the other hand, if the cell read is not verified, a programming step is done (block 1909). During the programming step, various programming operations may be done. The voltage of the top gate may be set incrementally (V-TG=V-TG0+dVTG) in combination with fixed or incremental V-SL, I-BL, V-WL, or Time or the source line voltage is incremented (V-SL=V-SL0+dVSL) in combination with fixed or incremental V-TG, I-BL, V-WL, or Time or the bit line current is set (I-BL=I-BL0+dIBL) in combination with fixed or incremental V-TG, V-SL, V-WL, or Time or the time incremented (Time=Time0+dTime) in combination with fixed or incremental V-TG, V-SL, I-BL, or V-WL. The count may be incremented. If the maximum count is not reached (block 1911), the verify is repeated (block 1907). On the other hand, if the verify count has been reached, then the cell is bad (block 1913) and the operation stops.

Figure 19B:
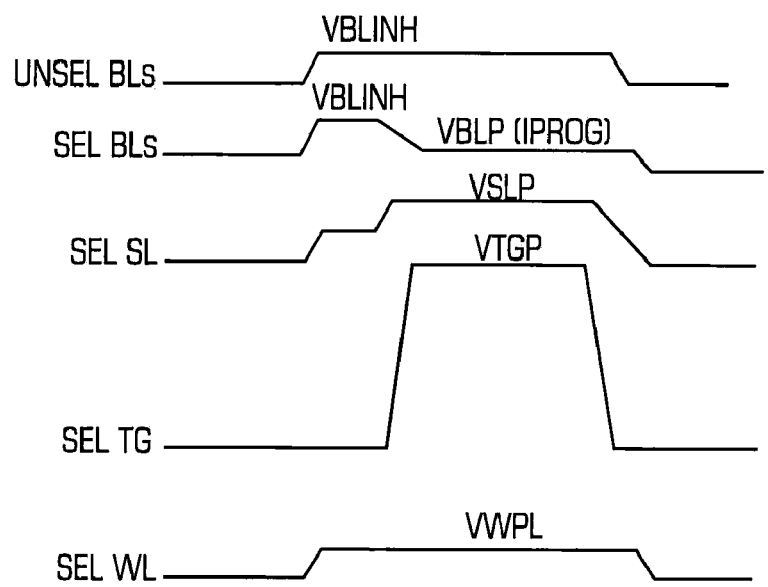
FIG. 19B is a waveform illustrating the operation of the top gate handling logic circuit of FIG. 9.

FIG. 19B is a waveform illustrating the operation of the top gate handling logic circuit of FIG. 9.

FIG. 19B shows an operational waveform for the top gate cell in programming. First all unselected bitlines and selected bitlines are pulled up to a bias voltage VBLINH to inhibit programming. At the same time or slightly after selected SL is pulled up to a bias voltage such as VBLINH. At the same time or slightly after selected WL is pulled up to a bias programming wordline voltage VWLP. Then selected SL is pulled up to a bias source line programming voltage VSLP. At the same time or slightly after selected TG is pulled up to a top gate programming voltage VTGP. At this time, the selected bitline is released from the previous bias VBLINH. A programming current applied to either earlier or applied at this time then pulls down the bitline to a stable bias voltage VBLP. The cell now sees complete programming condition at its terminal, VBLP, VWLP, VTGP. At the end of programming, to avoid possible disturb VTGP ramps down first, then VWLP ramps down. At the same time or slightly after VSLP ramps down. Finally all bitlines ramps down. This completes a programming cycle The system includes top gate capacitance loading and coupling handling. The metal may be arranged to minimize coupling effect between top gate lines by, for example, including shielding. In another embodiment, the top gates may be coupled using dynamic or pseudo-dynamic coupling.

Figure 20:
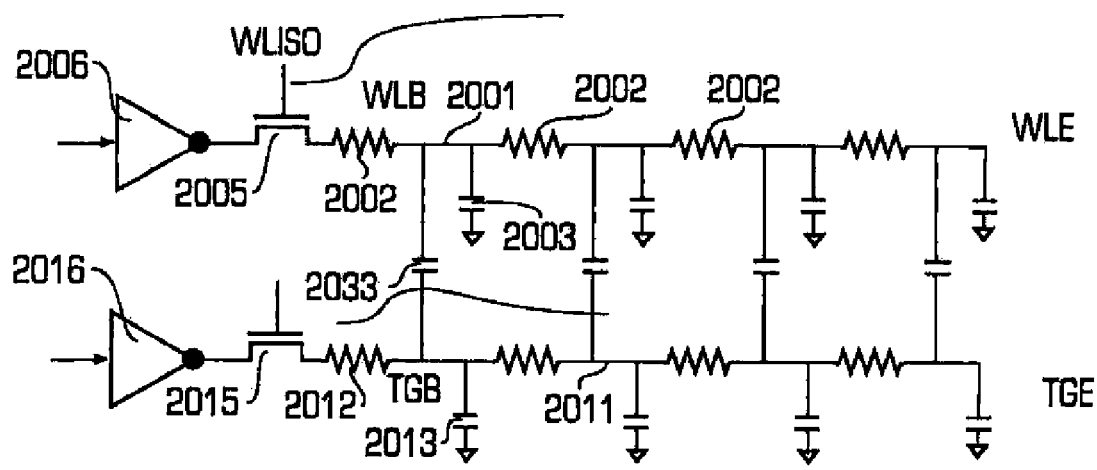
FIG. 20 is a schematic diagram illustrating the dynamic top gate coupling during a read according to a first embodiment.

FIG. 20 is a schematic diagram illustrating dynamic top gate coupling in a first embodiment.

A word line 2001 includes resistance represented by resistors 2002 and capacitance represented by capacitors 2003. A top gate line 2011 includes resistance represented by resistors 2012 and capacitance represented by capacitors 2013. The top gate line 2002 and the word line 2001 are controlled by enable transistors 2005 and 2015 and through an inverter 2006 and 2016. The word line 2001 and the top gate line 2011 are coupled together by a capacitance 2033. As the word line voltage increases, the coupling causes the top gate voltage to increase.

Figure 21:
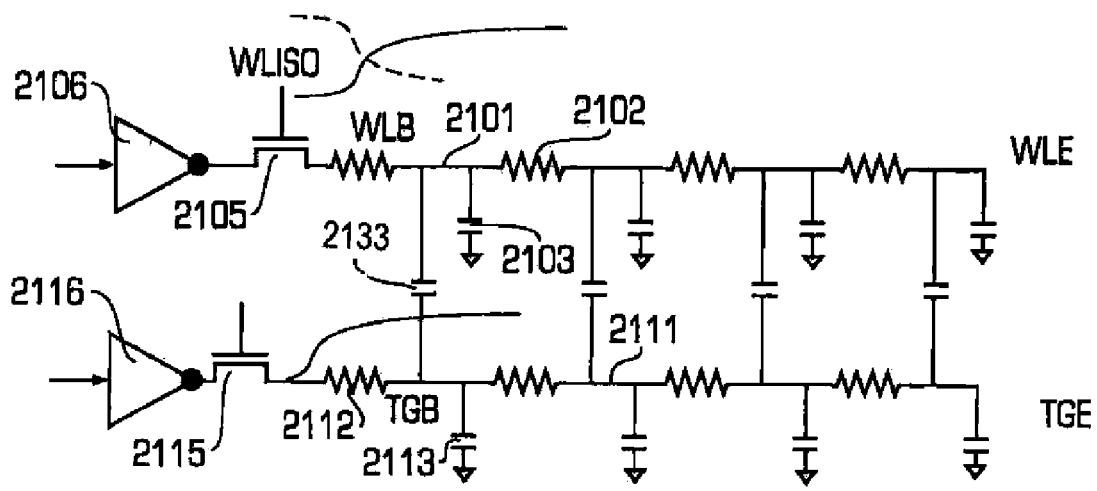
FIG. 21 is a schematic diagram illustrating the dynamic top gate coupling during a read according to a second embodiment.

FIG. 21 is a schematic diagram illustrating dynamic top gate coupling in a second embodiment.

A word line 2101 includes resistance represented by resistors 2102 and capacitance represented by capacitors 2103. A top gate line 2111 includes resistance represented by resistors 2112 and capacitance represented by capacitors 2113. The top gate line 2102 and the word line 2101 are controlled by enable transistors 2105 and 2115 and through an inverter 2106 and 2116. The word line 2101 and the top gate line 2111 are coupled together by a capacitance 2133. In this embodiment, the transistor 2115 is turned off after the top gate reaches a bias level so that the top gate line 2102 floats. In this the dynamic coupling causes the top gate to follow the word line. As the word line voltage increases or decreases, the coupling causes the top gate voltage to follow the word line voltage simultaneously.

In another embodiment, the driver of the top gate line may also be a weak driver to provide small bias which will provide similar coupling characteristics. In yet another embodiment, a dummy word line can be switched from one to zero for sector to cancel the word line (switched from zero to one) and gate line coupling but at the expense of additional area.

In the above description, the (top gate) latch is used to enable or disable the top gate. The latch may be also be used for word line or source line handling in a similar manner.

In the foregoing description, the top gate latch is used to disable the bad top gate. In another embodiment, the top gate latch is used to disable the program or erase of any top gate by disabling the high voltage latch. The top gate latch can also be used to disable the read of any memory cells by disabling the low voltage decoder side or disabling the top gate in read. The set or reset of the top gate latch in this case can be done by a power up recall, a command, or an internal control algorithm. The top gate latch can be used as a lock/unlock bit control for program, erase, or read In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

We Claim:

1. A method comprising:
   determining whether a top gate of a selected memory cell in a memory array is defective;
   verifying whether an output value of the selected memory cell is a value expected when the top gate is not defective; and
   programming the selected memory cell in the event that the output value is not the expected value;
   wherein the memory cells are source side injection memory cells; and
   wherein the memory cells are tip erased memory cells.

2. The method of claim 1 wherein the verification step includes verifying whether an output including one or more of a data output, a voltage output, and/or a current output corresponds to one or more of a data input, a voltage input, and/or a current input, respectively.

3. The method of claim 1 wherein the programming includes one terminal of the memory cell or bias thereof is fixed or incremental.

4. The method of claim 3 wherein the programming includes other terminals of the memory cell or biases being fixed or incremental.

5. The method of claim 1 further comprising performing a programming operation that uses a threshold to verify whether the memory cell is acceptable for use.

6. The method of claim 5 wherein the programming operation includes cell parameters subject to an increment or count function to determine if the threshold is reached.

7. The method of claim 1 wherein the memory array includes top gate operation using capacitance loading.

8. The method of claim 1 wherein gate metal is arranged to minimize a coupling effect between top gate lines in the memory array.

9. The method of claim 1 wherein top gates in the memory array are coupled using dynamic coupling or pseudo-dynamic coupling.

10. The method of claim 1 wherein one or more top gates are provided to enable operation using capacitance loading.

11. The method of claim 1 wherein top gates are provided to enable coupling via dynamic coupling or pseudo-dynamic coupling.

12. A memory system comprising:
a memory array comprising memory cells, wherein the memory cells are source side injection, tip erased memory cells;
circuitry including a decoder and control logic having a top gate handling circuit, wherein the circuitry is configured to:
determine whether a top gate of a memory cell selected for testing in the memory array is defective;
verify whether an output value of the memory cell is a value expected when the top gate is not defective; and
program the memory cell in the event that the output value is not the expected value.

13. The system of claim 12 wherein the circuitry is further configured to verify whether an output including one or more of a data output, a voltage output, and/or a current output corresponds to one or more of a data input, a voltage input, and/or a current input, respectively.

14. The memory system of claim 13 wherein the system is configured, in connection with program of the memory cell, such that one terminal of the memory cell or bias thereof is fixed or incremental.

15. The memory system of claim 13 the circuitry is further configured to perform a program operation that uses a threshold to verify whether the memory cell is acceptable for use.

16. The memory system of claim 15 wherein the circuitry is further configured such that the program operation includes cell parameters subject to an increment or count function to determine if the threshold is reached.

17. The memory system of claim 13 wherein the memory array is configured for top gate operation using capacitance loading.

18. The memory system of claim 13 wherein gate metal in the memory array is arranged to minimize a coupling effect between top gate lines.

19. The memory system of claim 13 wherein one or more top gates of the memory array are configured to enable operation using capacitance loading.

20. The system of claim 12 wherein the system is configured, in connection with program of the memory cell, such that one terminal of the memory cell or bias thereof is fixed or incremental.

21. The memory system of claim 12 the circuitry is further configured to perform a program operation that uses a threshold to verify whether the memory cell is acceptable for use.

22. The memory system of claim 12 wherein the circuitry is further configured such that the program operation includes cell parameters subject to an increment or count function to determine if the threshold is reached.

23. The memory system of claim 22 wherein the memory array is configured for top gate operation using capacitance loading.

24. The memory system of claim 22 wherein gate metal in the memory array is arranged to minimize a coupling effect between top gate lines.

25. The memory system of claim 22 wherein one or more top gates of the memory array are configured to enable operation using capacitance loading.

26. The memory system of claim 21 wherein the memory array is configured for top gate operation using capacitance loading.

27. The memory system of claim 21 wherein gate metal in the memory array is arranged to minimize a coupling effect between top gate lines.

28. The memory system of claim 21 wherein one or more top gates of the memory array are configured to enable operation using capacitance loading.

29. The memory system of claim 12 wherein the memory array is configured for top gate operation using capacitance loading.

30. The memory system of claim 29 wherein gate metal in the memory array is arranged to minimize a coupling effect between top gate lines.

31. The memory system of claim 29 wherein one or more top gates of the memory array are configured to enable operation using capacitance loading.

32. The memory system of claim 12 wherein gate metal in the memory array is arranged to minimize a coupling effect between top gate lines.

33. The memory system of claim 32 wherein one or more top gates of the memory array are configured to enable operation using capacitance loading.

34. The memory system of claim 12 wherein top gates in the memory array are configured to enable coupling via dynamic coupling or pseudo-dynamic coupling.

35. The memory system of claim 12 wherein one or more top gates of the memory array are configured to enable operation using capacitance loading.

* * * * *